(12) United States Patent
Fujiwara

(10) Patent No.: US 6,717,860 B1
(45) Date of Patent: Apr. 6, 2004

(54) METHOD OF ERASING NON-VOLATILE SEMICONDUCTOR MEMORY DEVICE AND SUCH NON-VOLATILE SEMICONDUCTOR MEMORY DEVICE

(75) Inventor: Ichiro Fujiwara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/664,480

(22) Filed: Sep. 18, 2000

(30) Foreign Application Priority Data

Sep. 17, 1999 (JP) .......................................... P11-264501

(51) Int. Cl.$^7$ ............................................. G11C 16/04
(52) U.S. Cl. .............................. 365/185.24; 365/185.29
(58) Field of Search ..................... 365/185.02, 185.24, 365/185.26, 185.29; 257/321

(56) References Cited

U.S. PATENT DOCUMENTS

| | | | | |
|---|---|---|---|---|
| 5,530,669 A | * | 6/1996 | Oyama | 365/185.29 |
| 5,999,444 A | * | 12/1999 | Fujiwara et al. | 365/185.02 |
| 6,011,725 A | * | 1/2000 | Eitan | 365/185.29 |
| 6,191,445 B1 | * | 2/2001 | Fujiwara | 257/321 |
| 6,282,123 B1 | * | 8/2001 | Mehta | 365/185.29 |
| 6,301,155 B1 | * | 10/2001 | Fujiwara | 365/185.02 |
| 6,324,099 B1 | * | 11/2001 | Iijima | 365/185.26 |
| 6,400,610 B1 | * | 6/2002 | Sadd | 365/185.29 |

* cited by examiner

*Primary Examiner*—Trong Phan
(74) *Attorney, Agent, or Firm*—Robert J. Depke; Holland & Knight LLP

(57) ABSTRACT

A method of erasing a non-volatile semiconductor memory device comprising, to raise the convergence of the erasure voltage, performing a write-erase operation, at least one write-erase operation after erasure, or a plurality of write-erase operations as an operation when erasing a memory transistor including dispersed charge storing means in a gate insulating film interposed between a channel-forming region of the semiconductor and a gate electrode and, to increase the erasure speed, optimizing an erasure voltage and/or an erasure time in accordance with the phenomenon of the absolute value of a voltage of an inflection point taking an extremum at the erasing side in a hysteresis curve shown the change of threshold voltage with respect to an applied voltage of the memory transistor becoming larger along with a shortening of a voltage application time.

29 Claims, 18 Drawing Sheets

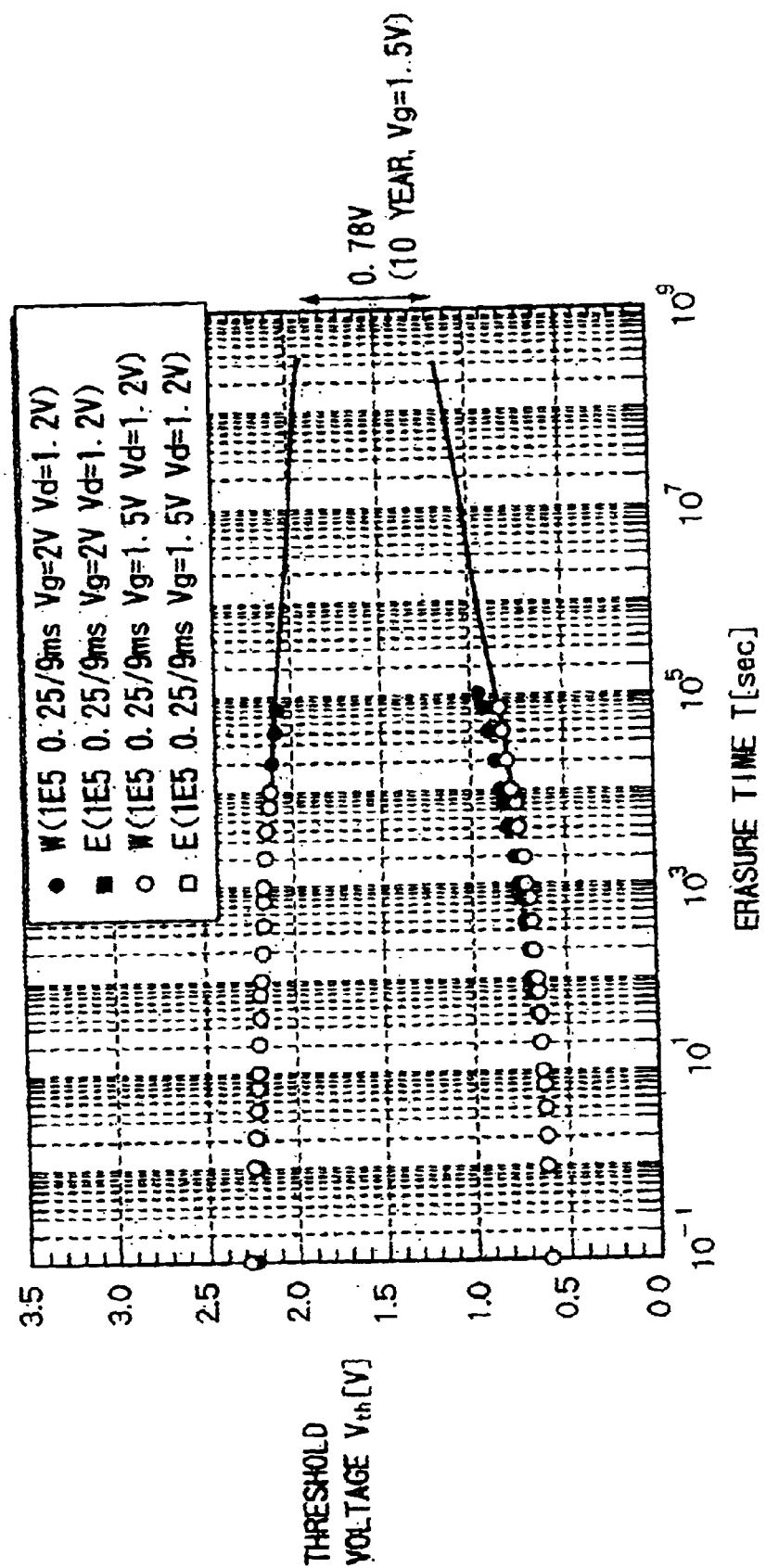

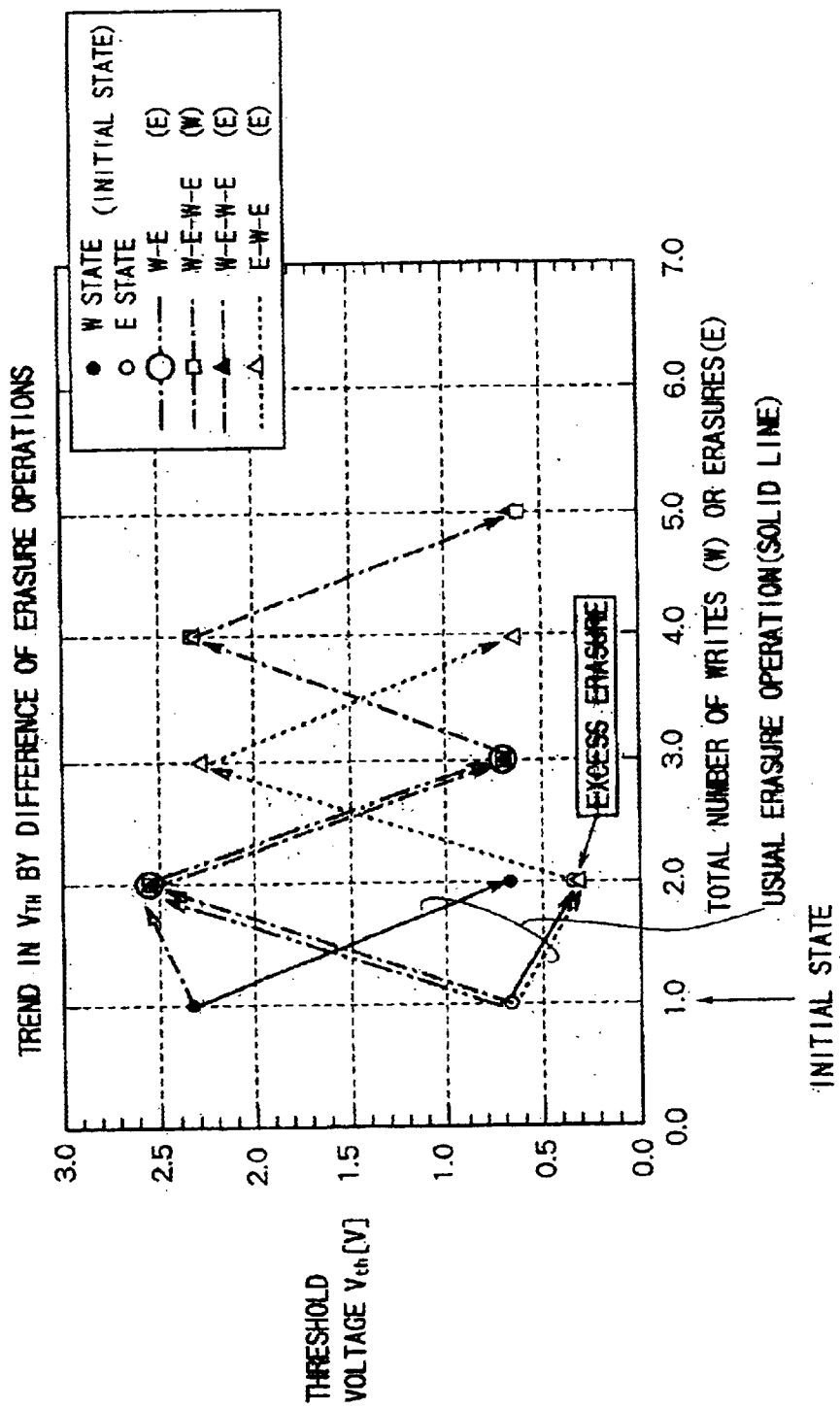

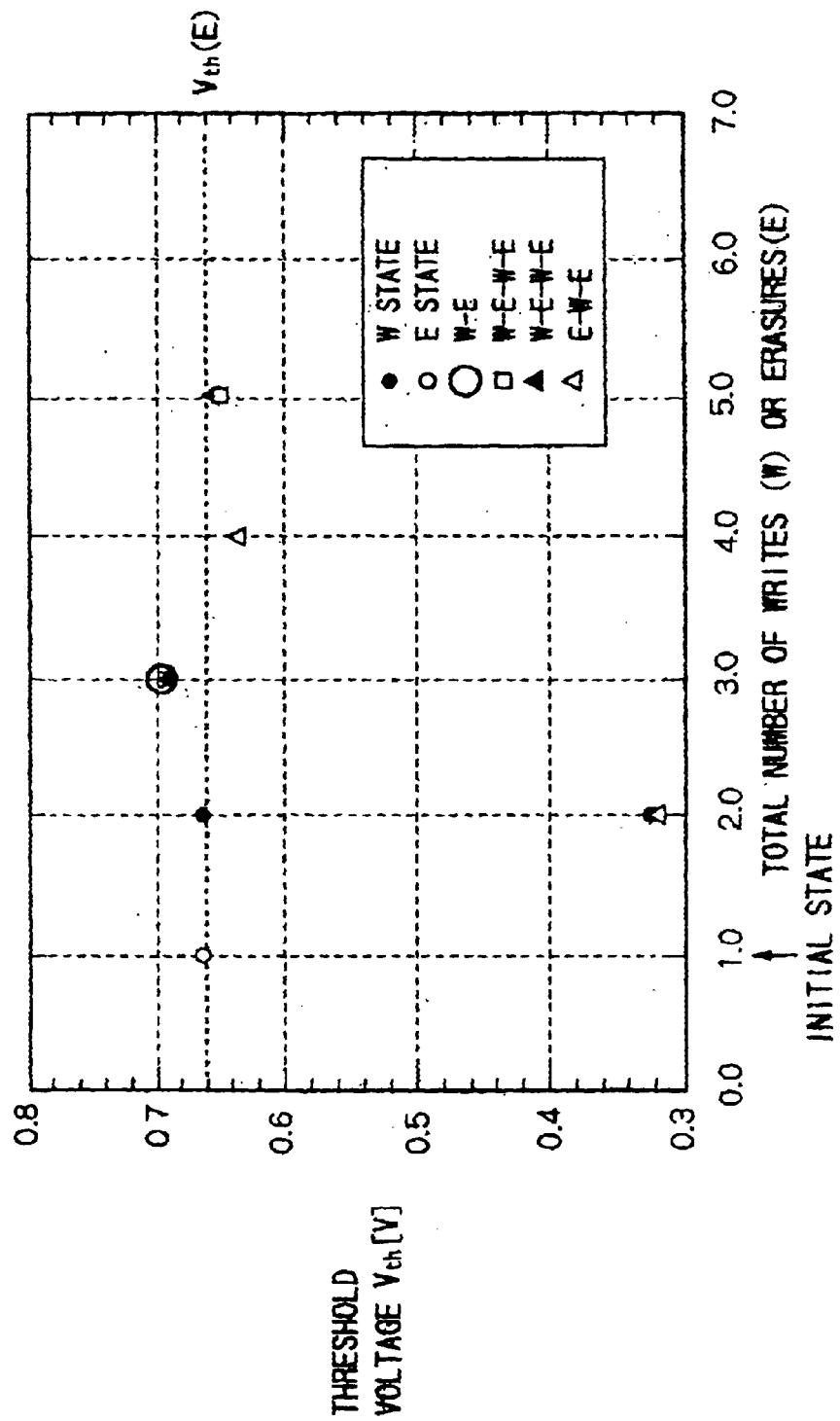

ERASURE OPERATION ACCORDING TO PRESENT INVENTION

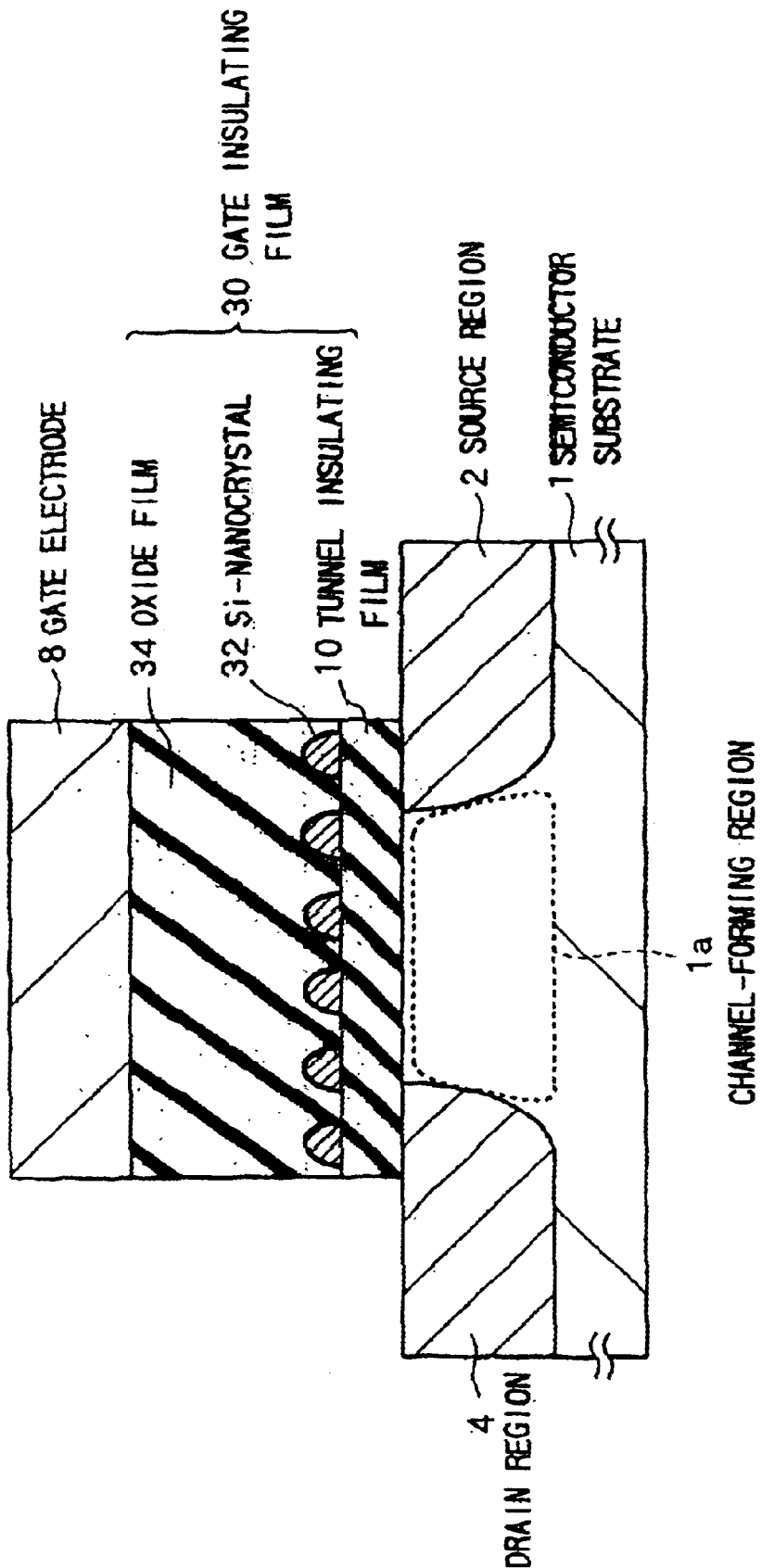

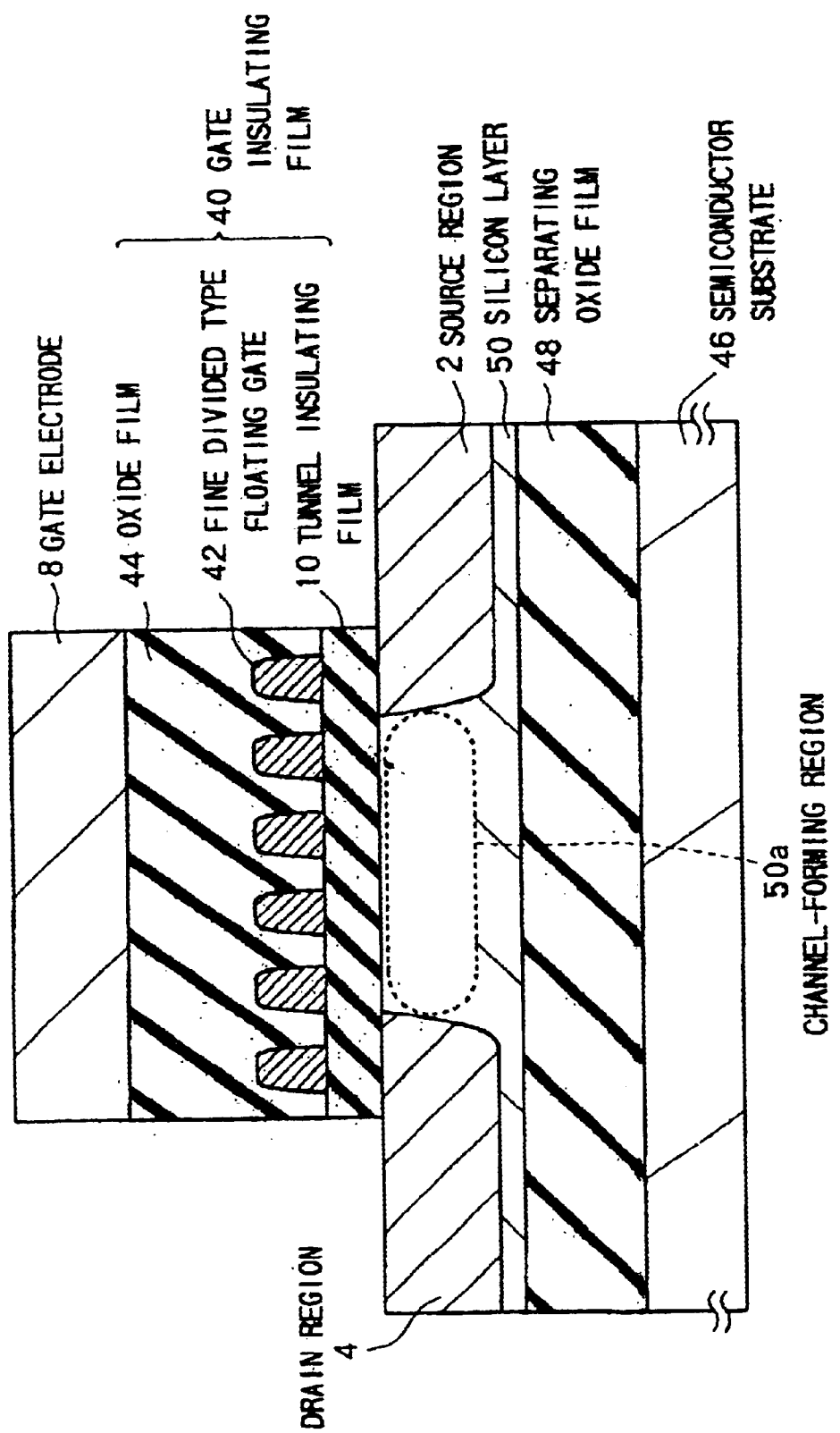

METHOD OF ERASING NON-VOLATILE SEMICONDUCTOR MEMORY DEVICE AND SUCH NON-VOLATILE SEMICONDUCTOR MEMORY DEVICE

RELATED APPLICATION DATA

The present application claims priority to Japanese Application No. P11-264501 filed Sep. 17, 1999, which application is incorporated herein by reference to the extent permitted by law.

BACKGROUND OF THE INVENTION

1. Field of the Invention

The present invention relates to a method of erasing a non-volatile semiconductor memory device having dispersed charge storing means (for example charge traps in a nitride film in a metal-oxide-nitride-oxide-semiconductor (MONOS) type and metal-nitride-oxide-semiconductor (MNOS) type, charge traps near the interface between a top insulating film and a nitride film, or fine particle conductors, etc.) inside a gate insulating film between a channel-forming region and a gate electrode of a memory transistor and performing, as its basic operation, injection of charges (electrons or holes) to the dispersed charge storing means for storage or withdrawing of the same and a such a non-volatile semiconductor memory device.

2. Description of the Related Art

Non-volatile semiconductor memories include, for example, the FG type wherein charge storing means (floating gate) for holding charges is made planarly and, also, the MONOS type wherein charge storing means (charge traps) are made planarly disperse.

In an FG type non-volatile memory transistor, a floating gate comprised of polyorystalline silicon etc. is stacked on a channel-forming region of a semiconductor via a gate insulating film. A control gate is further stacked on the floating gate via an inter-gate insulating film comprised of an oxide-nitride-oxide (ONO) film etc.

On the other hand, in a MONOS type non-volatile memory transistor, a tunnel insulating film comprised for example of a silicon oxide film, an oxynitride film, etc., an interlayer Insulating film comprised of a nitride film, oxynitride film, etc., and a top insulating film comprised of a silicon oxide film are successively stacked on the channel-forming region of the semiconductor. A gate electrode is formed on the top insulating film.

In a MONOS type non-volatile semiconductor memory, carrier traps serving mainly for holding charges in the nitride film ($Si_xN_y$ ($0<x<1$, $0<y<1$)) or at an interface between the top insulating film and the nitride film are discretely dispersed spatially (that is, in the planar direction and film thickness direction), so the charge holding characteristic depends on the energy and spatial distribution of the charge captured by the carrier trap in the $Si_xN_y$ film in addition to the tunnel insulating film thickness.

When a leakage current path locally occurs in the tunnel Insulating film, in the FG type, much of the charge passes through the leakage path and the charge holding characteristic is liable to decline, while in the MONOS type, since the charge storing means are spatially dispersed, the local charges around the leakage path pass through the leakage path and only locally leaks and therefore the charge holding characteristic of the overall memory device is resistant to decline.

Therefore, in the MONOS type, the problem of the decline of the charge holding characteristic caused by a tunnel insulating film becoming thinner is not as serious as in the FG type. Accordingly, the MONOS type is superior to the FG type in scaling of the tunnel oxide film in a fine memory transistor having an extremely short gate length.

In the above FG type non-volatile memory or MONOS type or other non-volatile memory where the charge storing means of the memory transistors are planarly dispersed, to reduce the cost per bit, increase the integration, and realize a large scale non-volatile memory, it is essential to realize a one-transistor type cell structure.

However, particularly in a MONOS type or other non-volatile memory, the mainstream is a two-transistor type wherein a selection transistor is connected to a memory transistor. Various studies are currently underway for establishing the one-transistor cell technique.

To establish the one-transistor cell technique, improvement of the disturb characteristic is necessary in addition to optimization of the element structure such as the gate insulating film including the charge storing means and improvement of the reliability. As one means for improving the disturb characteristic of a MONOS type non-volatile memory, studies are being conducted to set the tunnel insulating film thicker than the normal film thickness of 1.6 nm to 2.0 nm.

In a one-transistor cell, since there is no selection transistor in the cell, it is important to reduce the disturb characteristic of the memory transistor in non-selected cells connected to the same common line as a cell to be written in. The technique has already been proposed of applying an inhibit voltage to a source impurity region or drain impurity region of a non-selected memory transistor via a bit line or a source line at the time of writing or reading and thereby preventing erroneous writing and erroneous erasure of the non-selected memory transistor.

Summarizing the problems to be solved by the invention, in a MONOS or other non-volatile semiconductor memory with dispersed charge storing means, however, when the tunnel insulating film is made relatively thick in order to improve the disturb characteristic at the time of programming or a read operation, the erasure speed becomes relatively slow compared with the write speed. As a typical value, compared with a write speed of 0.1 to 1.0 msec, the erasure speed is 80 to 100 msec or two orders slower.

As another problem, in a non-volatile semiconductor memory, in block erasure, the cells in the write state and the cells in the erase state are simultaneously erased. If cells in the erase state are further erased at this time, there is the problem that the threshold voltage of part of the memory cells will become lower than the threshold voltage of the other memory cells due to excess erasing. This lowering of the threshold voltage causes an increase of the leakage current from the non-selected cells at the time of a read operation.

SUMMARY OF THE INVENTION

An object of the present invention is to provide a method of erasing a non-volatile semiconductor memory device capable of aligning both memory transistors in the erase state and memory transistors in the write state at a constant erased level.

Another object of the present invention is to provide a non-volatile semiconductor memory device having a structure suited for increasing an erasure speed of a MONOS or other memory transistor having a planarly dispersed charge storing means.

To achieve the first object, according to a first aspect of the present invention, there is provided a method of erasing a non-volatile semiconductor memory device having a memory transistor comprising a source region and a drain region formed on a surface portion of a semiconductor while sandwiching a channel-forming region there between, a gate insulating film provided on the channel-forming region and including dispersed charge storing means, and a gate electrode on the gate insulating film, the method comprising the steps of repeating a write-erase operation a plurality of times when erasing the memory transistor.

The method of erasing a non-volatile semiconductor memory device according to a second aspect of the present invention comprises, the steps of: performing an erase operation; and performing a write-erase operation at least once.

The method of erasing the non-volatile semiconductor memory device according to a third aspect of the present invention comprises, when erasing the memory transistor, the steps of: performing a write operation; and performing an erase operation.

The present invention is suitable for a separated source line NOR type and a NOR type non-volatile memory device with source lines and bit lines formed into hierarchies.

Further, concerning the memory transistor structure, the present invention is particularly suited to a MONOS type, a fine particle type having nanocrystals or other small size conductors, and other non-volatile memory transistors having the dispersed charge storing means formed to be dispersed at least in a surface direction facing the channel-forming region. These non-volatile memory transistors having planarly dispersed charge storing means are excellent in scaling of the tunnel insulating film in comparison with the FG type.

This memory device comprises the dispersed charge storing means does not have conductivity over an entire surface facing the channel-forming region at least when charges do not dissipate outside.

In the method of erasing a non-volatile semiconductor memory device according to the first and second aspects of the present invention, attention was paid to the fact that the convergence of the threshold voltage becomes higher in the case where one erasure time is shortened and the erase operation is repeated a plurality of times in the MONOS or other memory transistor.

For example, when erasing twice with a write operation in between, the threshold voltage converges considerably. Further, if a write-erase cycle is repeated at least twice, the convergence of the threshold voltage becomes even better. Accordingly, by applying this method of including a plurality of erase steps in one erasure operation, the total erasure time required for satisfying a predetermined convergence of the threshold voltage becomes shorter.

Note that the phenomenon of the convergence of the threshold voltage rising by a plurality of erasures is peculiar to the mechanism of operation of a MONOS type and does not exist in the FG type.

Accordingly, the method of erasing a non-volatile semiconductor memory device according to the third aspect of the present invention is fundamentally different in object from writing before erasure performed on the FG type for correcting the distribution of the threshold voltage in a wafer.

According to a fourth aspect of the present invention, there is provided a method of erasing a non-volatile semiconductor memory device having a memory transistor comprising a source region and a drain region formed on a surface portion of a semiconductor while sandwiching a channel-forming region there between, a gate insulating film provided on the channel-forming region and including dispersed charge storing means, and a gate electrode on the gate Insulating film, the method comprising the steps of: setting an erasure voltage and/or erasure time corresponding to the phenomenon of an absolute value of the voltage of an inflection point taking an extremum at the erasing side in a hysteresis curve of change shown the threshold voltage with respect to the applied voltage of the memory transistor becoming larger along with shortening of the voltage application time; and erasing the memory transistor by using that erasure voltage and/or erasure time.

Preferably, the erasure voltage is set within a range not exceeding the voltage of the inflection point in absolute value and the memory transistor is erased using the set erasure voltage and corresponding erasure time.

In this case, more preferably, the erasure voltage is set at the same value as the voltage of the Inflection point or between the voltage of the inflection point and the minimum voltage for generating an electric field required for causing the dispersed charge storing means to become saturated.

According to a fifth aspect of the present invention, there is provided a method of erasing a non-volatile semiconductor memory device having a memory transistor comprising a source region and a drain region formed on a surface portion of a semiconductor while sandwiching a channel-forming region there between, a gate insulating film provided on the channel-forming region and including dispersed charge storing means, and a gate electrode on the gate insulating film, the method comprising the steps of: setting the erasure voltage the same as the voltage of the inflection point taking an extremum at the erasing side in the hysteresis curve shown the change of threshold voltage with respect to the application voltage of the memory transistor or between the voltage of the inflection point and the minimum voltage for generating the electric field required for causing the dispersed charge storing means to become saturated; and erasing the memory transistor using the erasure voltage.

In the memory hysteresis characteristic, when the gate voltage of for example an nMOS transistor is made larger to a negative side, the amount of electrons injected from the gate electrode is increased relative to the amount of the holes injected from the substrate side into the charge storing means and the recombination region of the two changes in the thickness direction of the gate insulating film, so there is an inflection point at which the threshold voltage inverts from a reduction to increase.

The methods of erasing non-volatile semiconductor memory devices according to the fourth and fifth aspects utilize this phenomenon of the absolute value of the inflection point voltage becoming larger along with the shortening of the erasure time. That is, the shorter the erasure time, the greater the leeway for making the erasure voltage larger in absolute value and, as a result, the greater the erasure electric field and the higher the erasure efficiency.

The method of erasing a non-volatile semiconductor memory device according to a sixth aspect of the present invention comprises, in a single erasure operation of the memory transistor, the steps of: performing a plurality of erase operations including an erase operations using an erasure voltage the same as or smaller than, in absolute value, the voltage of the inflection point taking an extremum at the erasing side in a hysteresis curve shown the change of threshold voltage with respect to the applied voltage of the memory transistor while changing the erasure voltage and the erasure time.

This method of erasure is a combination of an increase of the erasure voltage based on the voltage of the inflection point and a plurality of erasures. By this, the total erasure time becomes further shorter.

In this case, for example, if the erasure time is short, erasure can be performed further faster using an erasure voltage exceeding the inflection point voltage. In general, if an erasure voltage exceeding the inflection point voltage is used, the threshold voltage after the erasure rises, but if the erasure time is short, this has almost no effect in reducing the difference in the threshold voltage between the erase state and the write state (threshold value window). Conversely, there is the large advantage of increasing the erasure voltage in absolute value and shortening the total erasure time.

To achieve the second object, according to a seventh aspect of the present invention, there is provided a non-volatile semiconductor memory device having a memory transistor comprising a source region and a drain region formed on a surface portion of a semiconductor while sandwiching a channel-forming region there between, a gate insulating film comprised of a tunnel insulating film, a nitride film, and a top insulating film sequentially stacked on the channel-forming region and including dispersed charge storing means in the stacked films, and a gate electrode on the gate insulating film, wherein thicknesses of the tunnel insulating film and the top insulating film are set so that the thickness of the gate insulating film converted to an oxide film becomes 10 nm or less and the change of the threshold voltage at the time of erasing the memory transistor is regulated by a recombination process of a hole current injected from the channel-forming region side and an electron current injected from the gate electrode side.

Preferably, the thickness of the tunnel insulating film is 2.5 nm or more, and a ratio of thickness of the top insulating film to the tunnel insulating film is 1.4 or more.

The voltage at which the inflection point appears is physically defined by a relative magnitude between the hole current injected from the channel-forming region side and the electron current injected from the gate electrode side, a recombination efficiency of electrons and holes, and a probability of catch and escape of the traps. This hole current and the electron current depend upon the specifications such as the thickness of the film constituting the gate insulating film (for example ONO film) in addition to the erasure conditions, that is, the erasure voltage and the erasure time.

In the non-volatile semiconductor memory device according to the present invention, the thickness conditions of the tunnel insulating film and the top insulating film among the films constituting this gate insulating film (for example ONO film) are defined so that the absolute value of the inflection point voltage easily becomes large. Accordingly, the erasure time for acquiring the threshold voltage of the predetermined erase state can be easily shortened in the structure.

BRIEF DESCRIPTION OF THE DRAWINGS

These and other objects and features of the present invention will become clearer from the following description of the preferred embodiments given with reference to the accompanying drawings, in which:

FIG. 10 is a graph showing a read disturb characteristic after 100,000 data rewrites in an nMOS memory transistor according to the first embodiment of the present invention;

FIG. 11 to a graph showing trends in a threshold voltage in write-erase (W-E), erase-write-erase (E-W-E), and write-erase-write-erase (W-E-H-E) erasure operations in an nMOS memory transistor according to the second embodiment of the present invention in comparison with an erasure operation of the related art;

FIG. 12 is a graph showing by an enlarged view a portion near an erasure threshold voltage of FIG. 11 according to a second embodiment of the present invention;

FIG. 17 is a sectional view of an element structure of a Si-nanocrystal type memory transistor according to a fourth embodiment of the present invention; and FIG. 18 is a sectional view of an element structure of a fine divided FG type memory transistor according to a fifth embodiment of the present invention.

DESCRIPTION OF THE PREFERRED EMBODIMENTS

Below, preferred embodiments will be described with reference to the accompanying drawings.

First Embodiment

Figure 1:
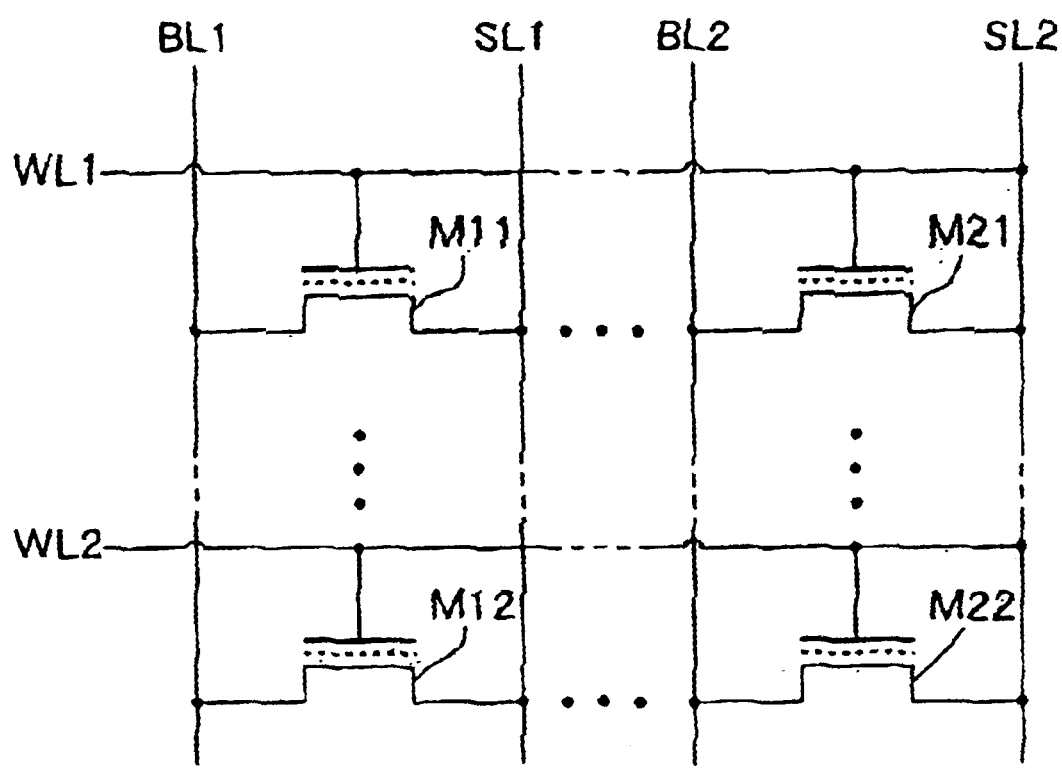
FIG. 1 is a view of the schematic configuration of a separated source line NOR type non-volatile semiconductor memory according to embodiments of the present invention.

FIG. 1 is a view of the schematic configuration of a separated source line NOR type non-volatile semiconductor memory according to embodiments of the present invention.

In a nonvolatile memory device of the present embodiment, each memory cell of the NOR type memory cell array is comprised of one memory transistor. As shown in FIG. 1, memory transistors M11 to M22 are arranged in rows. The transistors are connected by word lines, bit lines, and separated type source lines.

Namely, the drains of the memory transistor M11 and M12 adjacent to each other in the bit direction are connected to a bit line BL1, while the sources are connected to a source line SL1. Similarly, the drains of the memory transistors M21 and M22 adjacent to each other in the bit direction are connected to a bit line BL2, while the sources are connected to a source line SL2.

Also, the gates of the memory transistors M11 and M21 adjacent in the word direction are connected to the word line WL1, while the gates of the memory transistors M12 and M22 adjacent in the word direction are connected to the word line WL2 in the same way.

In the memory cell array as a whole, cells are arranged and cells are connected repeatedly in this way.

Figure 2:
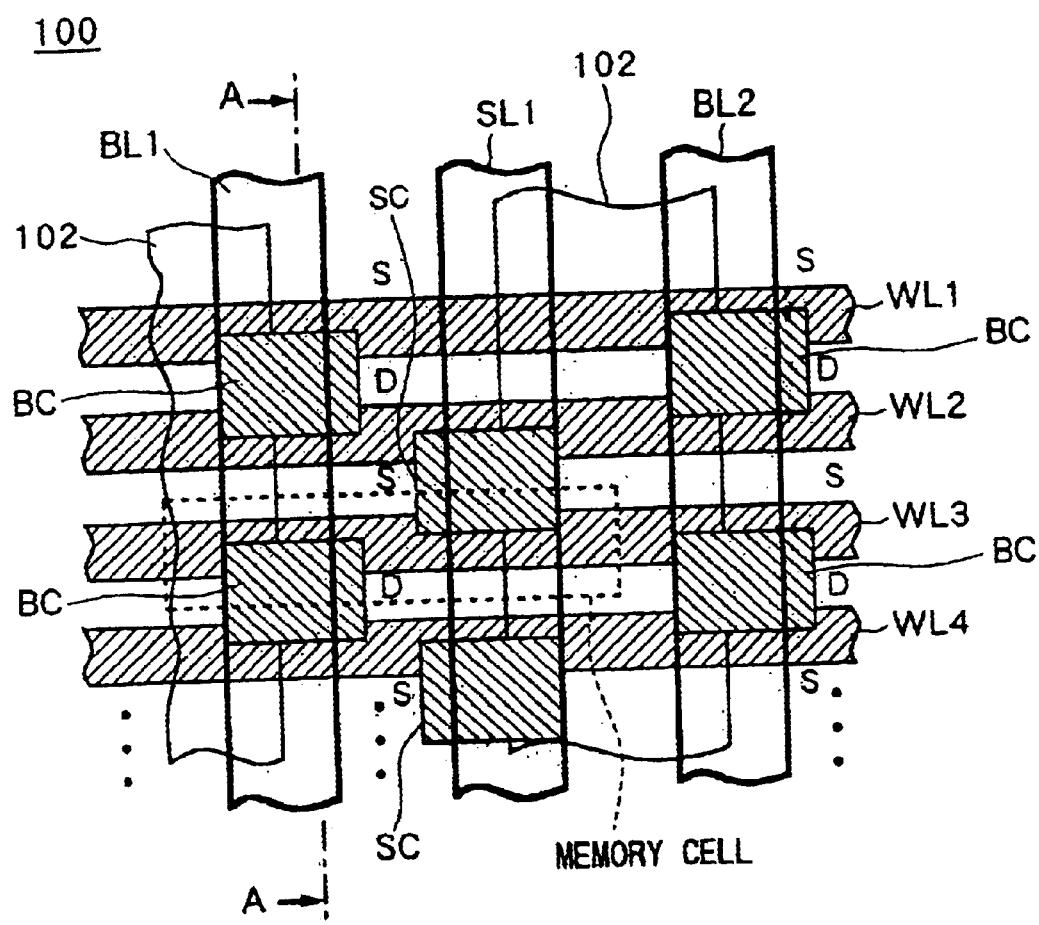
FIG. 2 is a schematic plan view of a miniature NOR type cell array using self-alignment as an example of a specific cell arrangement pattern according to a first embodiment of the present invention.
Figure 3:
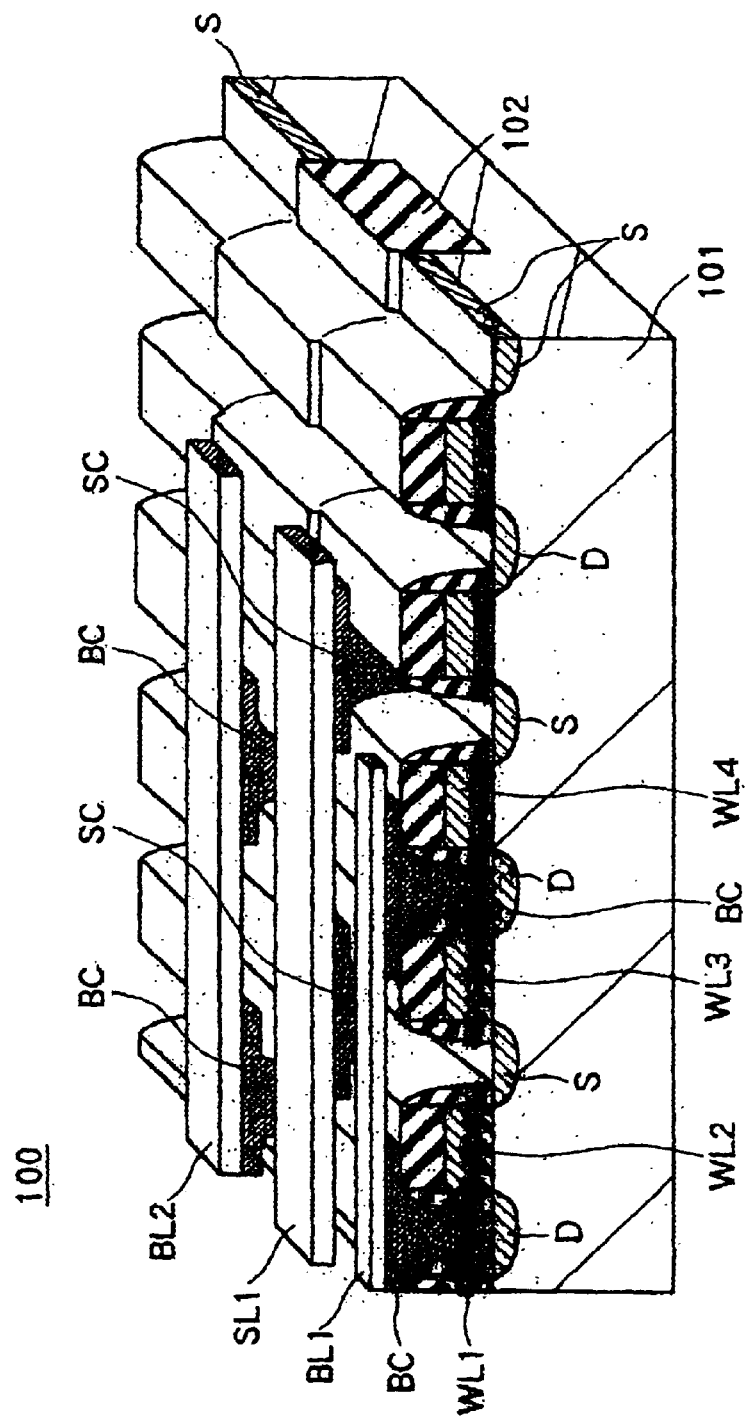
FIG. 3 is a bird's eye view seen from a cross-section taken along the line A–A' in the cell array of FIG. 2 according to the first embodiment of the present invention.

FIG. 2 is a schematic plan view of a miniature NOR type cell array using self alignment as a specific example of a cell arrangement pattern. FIG. 3 is a bird's eye view seen from a cross-section taken along the line A–A' in FIG. 2.

In the miniature NOR type cell array 100, as shown in FIG. 3, an element separation insulating layer 102 is formed by trench or LOCOS etc. on the surface of an n-type or p-type semiconductor substrate 101 (n-well or p-well also possible). The element separation insulating layer 102 is, as shown in FIG. 2, arranged in long parallel stripes in the bit direction (longitudinal direction in FIG. 2). The word lines WL1, WL2, WL3, WL4, . . . are arranged at equal intervals substantially orthogonal to the element separation insulating layer 102. The word lines are, as will be explained later on, configured by stacking a gate insulating film comprised of a tunnel insulating film, nitride film, and top insulating film and a gate electrode.

In the active regions in the intervals of the element separation insulating layer 102, impurities of a conductivity type opposite to the substrate 101 are doped in a high concentration at the spaces between the word lines so as to alternately form source regions S and drain regions D. The source regions S and drain regions D are defined in size in the word direction (lateral direction in FIG. 2) by only the intervals between the trenches or the LOCOSs or other element separation insulating layers 102 and defined in the bit direction by only the intervals between word lines. Accordingly, the source regions S and the drain regions D are not affected much at all by errors in mask alignment relating to the variations of the size and arrangement, so they are formed extremely uniformly.

Upper portions and side walls of the word lines are covered with an insulating layer. Namely, offset insulating layers are arranged in the same pattern on the word lines WL1, WL2, . . . , while side-wall insulating layers are formed at the two side walls of a stacked pattern comprised of the offset insulating layer, the gate electrode (word lines) below that, and the gate insulating layer. Elongated self-aligned contacts are formed along the word lines at space portions between the word lines by the offset insulating layers and the sidewall insulating layers.

Conductive materials are burled alternately in the self aligning contacts so as to be partially overlapped the source regions S or drain regions D, thus bit contact plugs BC and source contact plugs SC are formed.

In forming the bit contact plugs BC and the source contact plugs SC, the conductive material is deposited so as to bury the entire self aligning contact region and a resist pattern for an etching mask is formed thereon. At this time, the resist pattern is made one size larger than the width of the self aligning contacts and partially superimposed on the element separation insulating layer. Further, the conductive material around the resist pattern is removed by etching using the resist pattern as a mask. As a result, the bit contact plugs BC and the source contact plugs SC are formed at the same time.

The concavities around the contacts are burled with a not shown insulating film.

On the insulating film, the bit lines BL1, BL2, . . . contacting the bit contact plugs BC and the source lines SL1, SL2, . . . contacting the source contact plugs SC are alternately formed in parallel stripes.

In the miniature NOR type cell array 100, contacts are formed on the bit lines and the source lines by self alignment contact formation and plug formation. Insulation and separation of the word lines are attained by forming the self aligning contacts, and the exposed surfaces of the source regions S and the drain regions D are uniformly formed. The bit contact plugs BC and the source contact plugs SC are formed on the exposed surfaces of the source regions S or the drain regions D in the self aligning contacts. Accordingly, the substrate contacting surfaces of the plugs are mostly determined in size in the bit direction by the self alignment contact formation, so there is that much less variation in the contact areas.

Insulation and separation of the bit contact plugs BC or the source contact plugs SC and the word lines are easy. Namely, the offset insulating layers are formed all once when forming the word lines, then the sidewall insulating layers are formed by just forming the insulating film and etching (etching back) the entire surface.

Also, since the bit contact plugs BC and the source contact plugs SC and further the bit lines and the source lines are formed by patterning the same layer of the conductive layer, the interconnection structure is extremely simple, the number of steps is small, and the structure is advantageous for suppressing the production costs.

Furthermore, since there is almost no wasted space, when forming the layers by the minimum line width P of the wafer processing limit, production is possible with a very small cell area close to $8F^2$.

Figure 4:
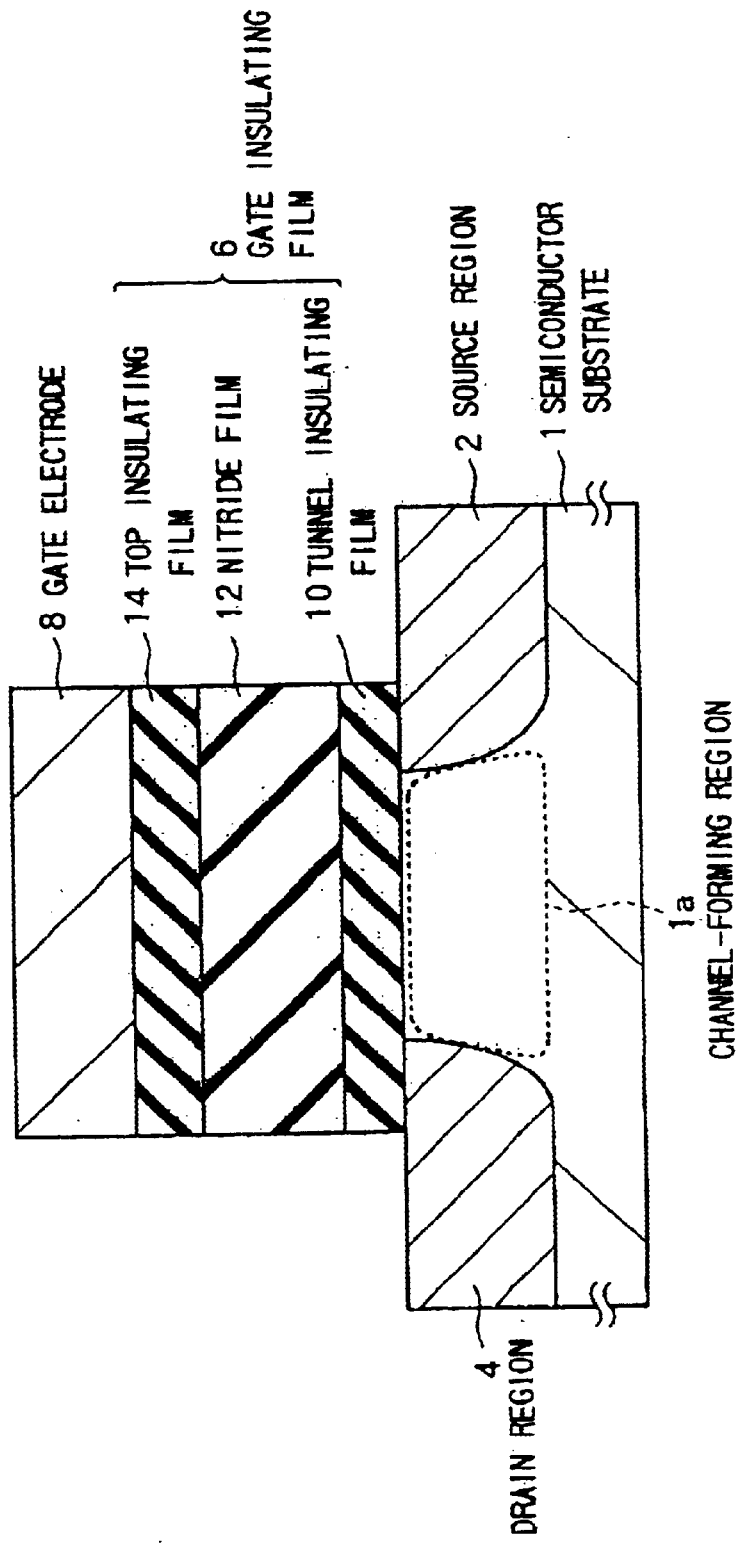
FIG. 4 is a sectional view of the element structure of a MONOS type memory transistor according to the first embodiment of the present invention.

FIG. 4 is a sectional view of the element structure of a MONOS type memory transistor according to the present embodiment.

In FIG. 4, reference numeral 1 indicates a silicon wafer or other semiconductor substrate or well having an n-type or p-type conductivity, 1a indicates a channel-forming region, and 2 and 4 indicate a source region and, a drain region of the memory transistor.

The "channel-forming region" in the present invention refers to a region where a channel through which electrons or holes pass is formed inside the surface side. The "channel-forming region" in the present embodiment is a portion sandwiched by a source region 2 and drain region 4 in the semiconductor substrate or well 1.

The source region 2 and the drain region 4 are regions having a high conductivity formed by doping impurities of an opposite conductivity to the channel-forming region 1a at a high concentration into the semiconductor substrate 1. There are a variety of forms. Normally, a low concentration region called a lightly doped drain (LDD) is often provided at the position on the substrate surface facing the channel-forming region 1a of the source region 2 and the drain region 4.

A gate electrode 8 of the memory transistor Is stacked via the gate insulating layer 6 on the channel forming region 1a. The gate electrode 8 is generally comprised of polycrystalline silicon (doped poly-Si) made conductive by being doped with p-type or n-type impurities at a high concentration or stacked films of doped poly-Si and a refractory metal silicide.

The gate insulating film 6 in the present embodiment is configured, in order from the lower layer, by a tunnel insulating film 10, a nitride film 12, and a top insulating film 14.

The tunnel insulating film 10 may be a film of silicon oxide ($SiO_2$) formed by thermal oxidation, but in the present embodiment is comprised of an oxynitride film obtained by forming an oxide film by rapid thermal oxidation (RTO) and then processing this by rapid thermal nitridation (RTN). The thickness of the tunnel insulating film 10 may be determined in a range of 2.0 nm to 3.5 nm in accordance with the application of use. Here, it is set to 2.7 $\mu$m.

The nitride film 12 is configured for example by a silicon nitride ($Si_xN_y$ (0<x<1, 0<y<1)) film. The nitride film 12 is prepared for example by low pressure CVD (LP-CVD). A large number of carrier traps are included in the film. The nitride film 12 exhibits a Frenkel-Poole (FP) type electro conductive characteristic.

In the top insulating film 14, it is necessary to form deep carrier traps at a high density near the interface with the nitride film 12. For this purpose, for example it is formed by thermal oxidation of a formed nitride film 12. Also, the top insulating film 14 may be a $SiO_2$ film formed by a high temperature chemical vapor deposition oxide (HTO) method. When the top Insulating film is formed by CVD, the traps are formed by heat treatment. The thickness of the top Insulating film is required to be at least 3.0 nm, preferably not less than 3.5 nm, for effectively blocking injection of holes from the gate electrode 8 and preventing a decrease of the rewitable number of data.

Normally, at the time of erasure, the entire memory cell array or an entire block is erased at the same time.

A predetermined erasure voltage which is low on the well side but high on the word line side is applied between the well (or semiconductor substrate) of the memory cell array or the block to be erased and the word line. As specific modes for setting the erasure bias, there are the case of grounding the word line and applying a positive voltage to the well, the case of grounding the well and applying a negative voltage to the word line, and the case of applying a positive intermediate voltage to the well and applying a negative intermediate voltage to the word line. Note that, in each of these cases, the source line (source region) and the bit line (drain region) may be controlled by the same potential as the well or one or both of them may be placed in the open state.

By the application of this erasure voltage, in the memory cells constituting the memory cell array or the erasure block, electrons stored in the dispersed charge storing means (charge traps) are withdrawn to the substrate side, and holes are injected from the substrate side into the dispersed charge storing means and trapped. By this, the stored data is erased all together.

Next, an explanation will be given of the increase of speed by the shortening of the voltage application time (erasure time) at the time of this erasure. Note that the following study of erasure characteristics was carried out using an erase mode of grounding the well and applying a negative voltage to the gate electrode.

Figure 5:
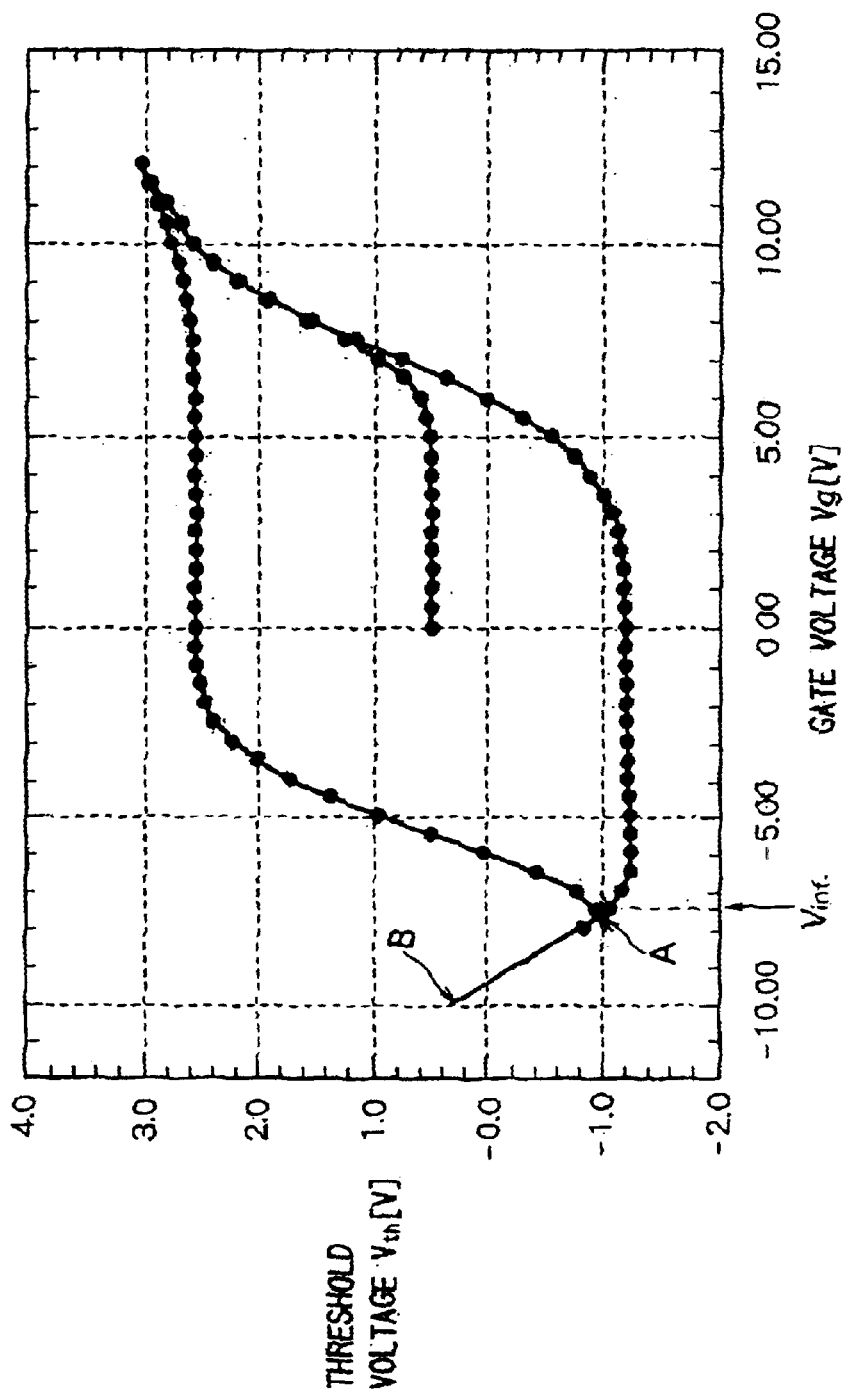
FIG. 5 is a graph showing a memory hysteresis characteristic in an nMOS memory transistor according to the first embodiment of the present invention.

FIG. 5 shows the memory hysteresis characteristic in an nMOS memory transistor when the write/erasure time (charge injection time) is 1 sec.

A gate applied voltage is made larger toward the negative side from the write state in the hysteresis (threshold voltage Vth (W): about 2.5 to 3V). At this time, after the threshold voltage Vth sharply falls and the erase state is entered (threshold voltage Vth (E): near about −1V), the change thereof inverts from a fall to rise at the point A in FIG. 5. The voltage at the time of this inversion is defined here as an "inflection point voltage of the memory hysteresis characteristic". The inflection point voltage Vinf is physically defined by the relative magnitude between the hole current injected from the channel-forming region side and the electron current injected from the gate electrode side, the recombination efficiency between the electrons and the holes, and the probability of the catch and escape at the traps.

The electron current and the hole current flowing through the ONO film in the erase step, that is, when a negative voltage is applied to the gate electrode, were measured. The measurement results are shown together in the graph of FIG. 6.

Figure 6:
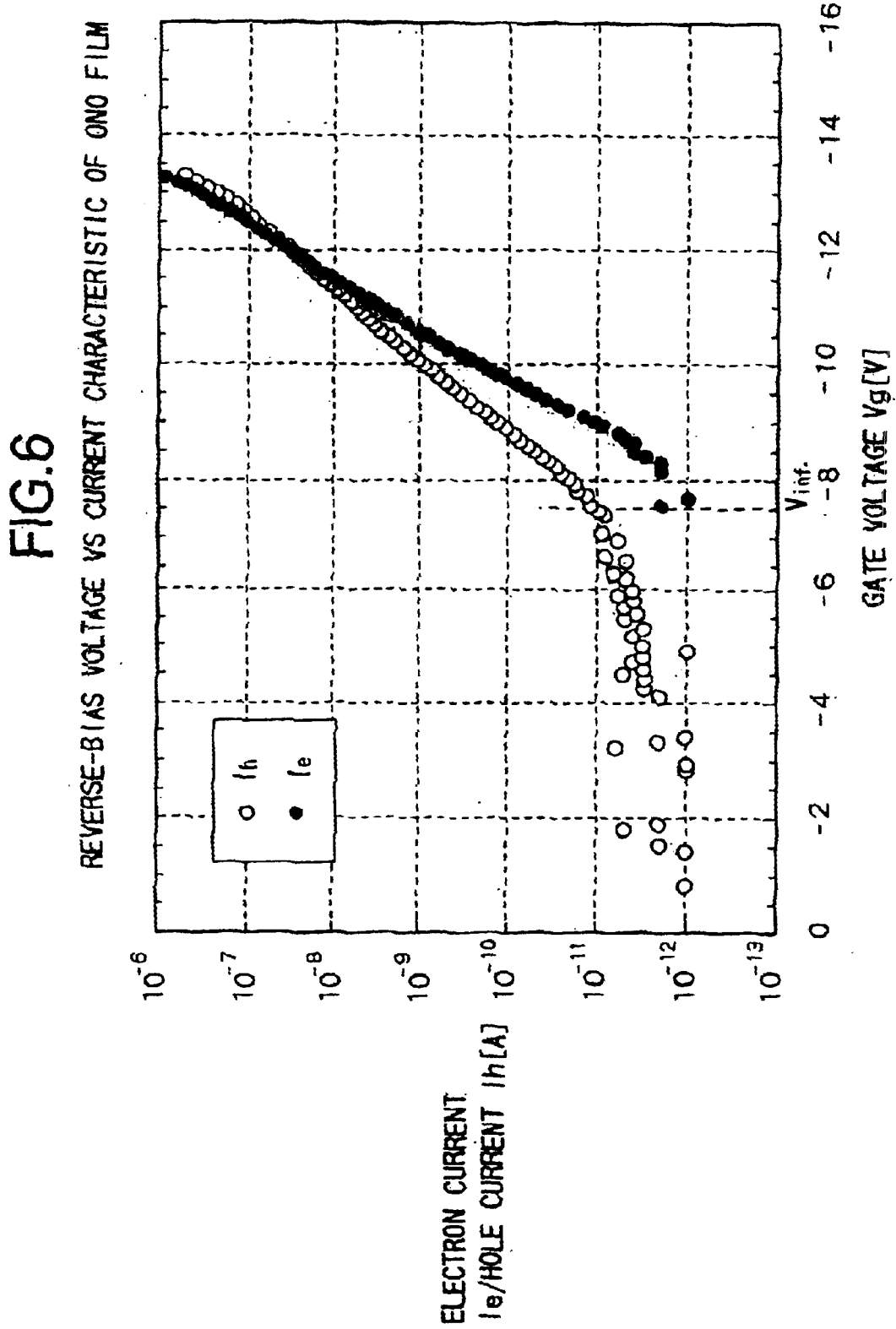
FIG. 6 is a graph showing together the measurement results when measuring the erasure process, that is, the electron current and a hole current flowing through an ONO film when applying a negative voltage to a gate electrode, in an nMOS memory transistor according to the first embodiment of the present invention.

As shown in FIG. 6, when increasing a gate voltage Vg toward the negative side from the inflection point voltage Vinf −7.5V, the electron current Ie injected from the gate electrode increases relative to the hole current injected into the ONO film from the substrate side. As a result, as shown in FIG. 5, the threshold voltage Vth gradually increases at the negative side from the inflection point voltage Vinf (point A) and reaches a point B, and the threshold value window is reduced.

On the other hand, the hole current and the electron current depend upon the specifications of the gate insulating film (for example ONO film) (thickness and quality of the component films). Accordingly, in the present embodiment, for the purpose of facilitating expansion of the range of setting the erasure voltage by making this inflection point voltage Vinf (point A) larger toward the negative side, a thickness condition is imposed on the gate insulating film 6. That is, in the gate insulating film 6 according to the present, embodiment, the thickness converted to an oxide film is set to 10 nm or less and the ratio of thickness of the top insulating film with respect to the tunnel insulating film 10 is set to 1.4 or more. Further, from the viewpoint of the improvement of the disturb characteristic, the tunnel insulating film 10 is set to 2.5 nm or more. For example, the tunnel insulating film is set to 2.7 nm, the nitride film is set to 5.8 nm, and the top insulating film is set to 3.8 nm, and the thickness, converted to oxide films, of these stacked films is set to 9.5 nm.

Figure 7:
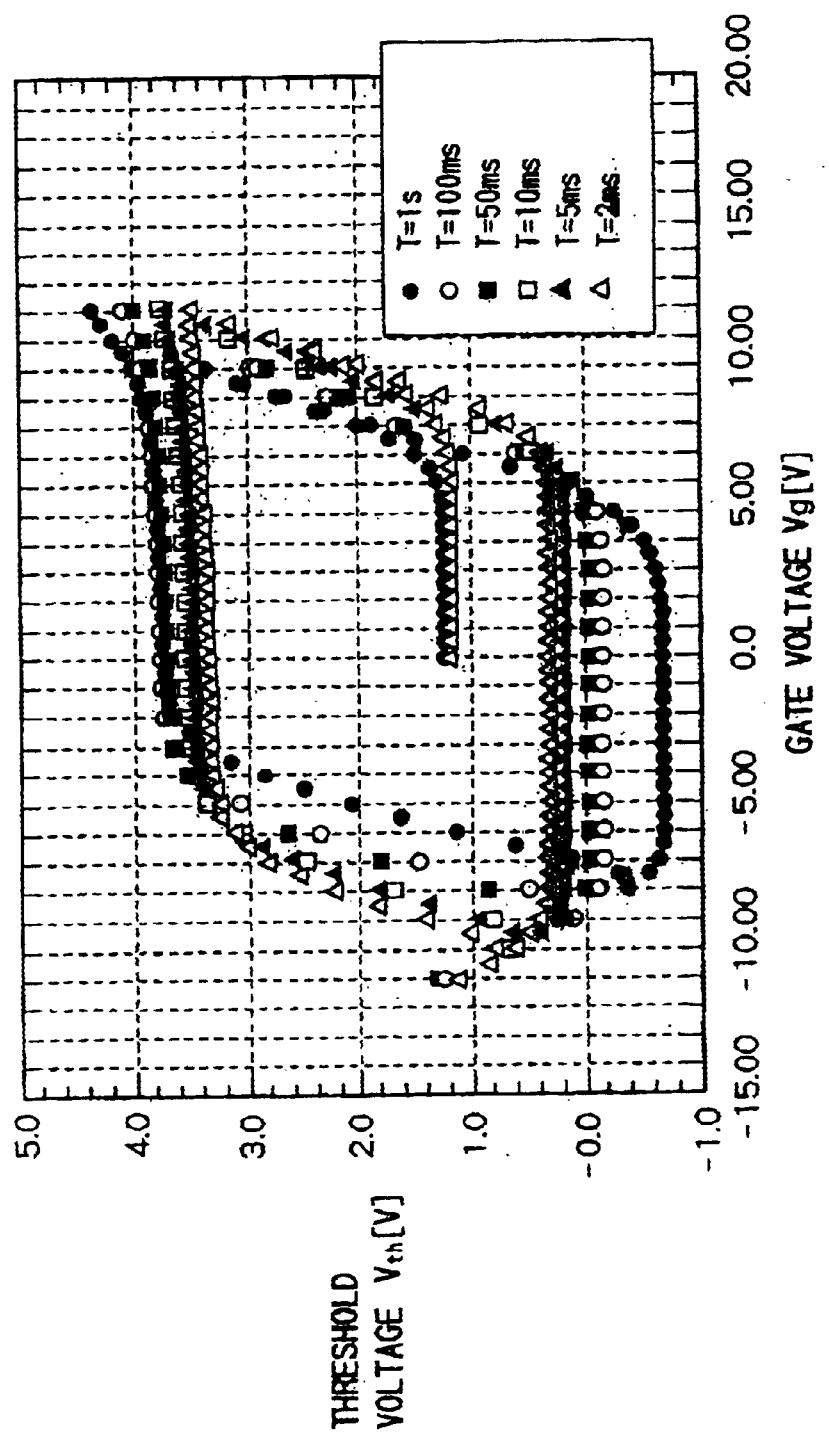
FIG. 7 is a graph showing a measurement time (charge injection time) dependency of a memory hysteresis curve in an nMOS memory transistor according to the first embodiment of the present invention.

FIG. 7 shows the measurement time (charge injection time) dependency of the memory hysteresis curve of a MONOS memory transistor.

Conventionally, the memory hysteresis curve is frequently measured in the time where the opening of the memory hysteresis curve (threshold value window) is saturated at the maximum value, that is, about 1 sec. Further, from the viewpoint of obtain as large a threshold value window as possible, the voltage application time at the time of actual erasure was set to a time 80 of 100 msec where a sufficient threshold value window could be obtained at a voltage where the memory hysteresis curve became saturated.

In FIG. 7, the measurement is carried out several times while gradually reducing the measurement time of the memory hysteresis curve from 1 sec. The results are shown together.

From FIG. 7, it is learned that the memory hysteresis characteristic exhibited a measurement time dependency and that the threshold value window tends to be gradually reduced together with the reduction of the measurement time, but that a sufficient threshold value window for practical use could be obtained even by a measurement time T of 2 msec. The fact that there is a maximum value to the threshold value window is related to the fact that the dispersed charge storing means (number of carrier traps) are finite. Further, the reduction of the threshold value window shows that the ratio between the amounts of injection of the two charges and the amount of the recombination when the electron current and the hole current are balanced and become uniform changes depending upon the charge injection time.

Further, it was learned that, as the measurement time was made shorter, the inflection point voltage Vinf shifted in the direction increasing in absolute value at the negative side and that the range where the erasure voltage could be set was expanded in the direction of increasing the absolute value. For example, it was found that if the erasure time was 10 msec, the erasure voltage could be set to −9V, while if the erasure time was 5 sec, the erasure voltage could be set to −9.5V.

Figure 8:
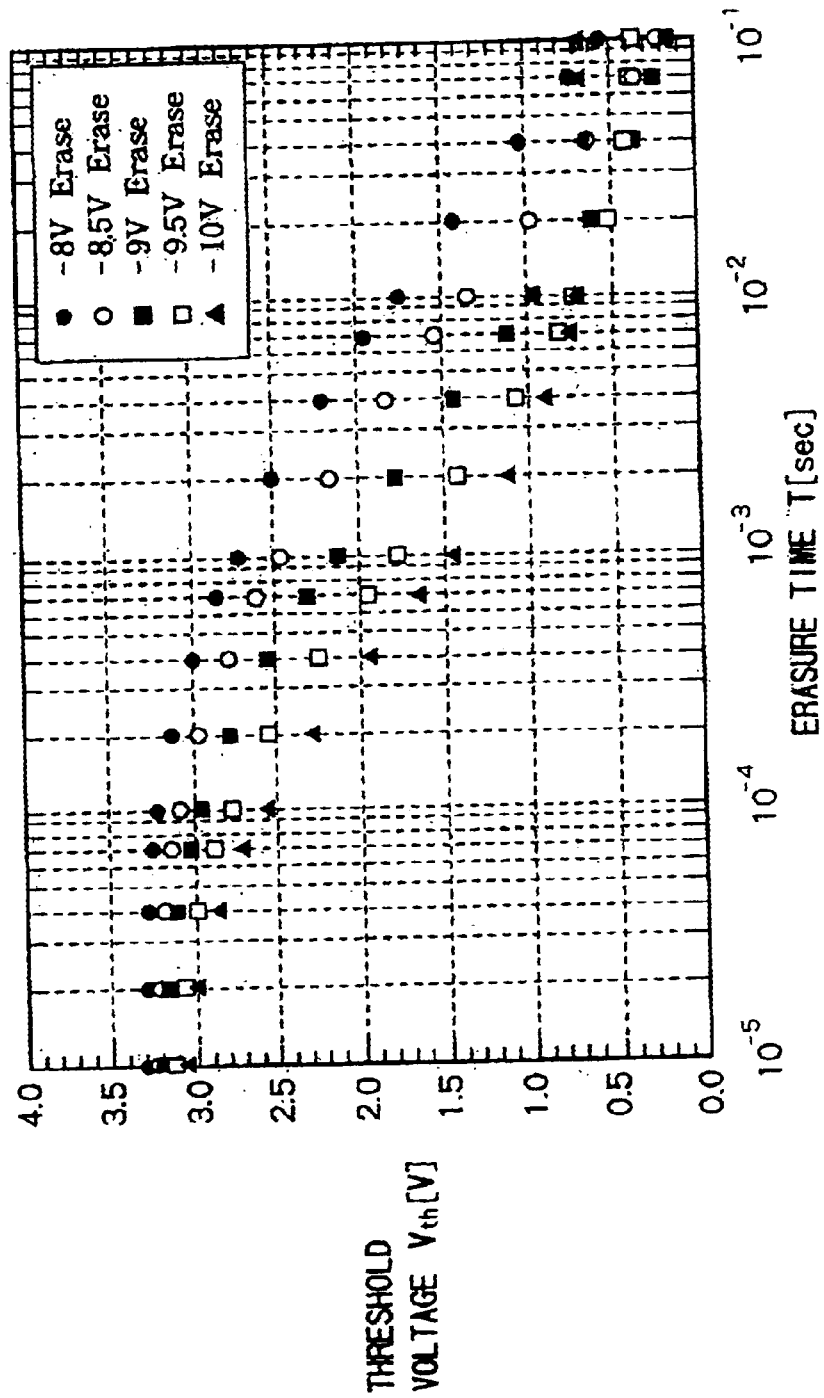
FIG. 8 is a graph showing an erasure characteristic in an nMOS memory transistor according to the first embodiment of the present invention.

FIG. 8 shows the erasure characteristic of a MONOS memory transistor.

As shown in FIG. 8, the threshold voltage Vth tends to decrease with respect to the erasure time. Where the erasure voltage is a large −10V, the electron current and the hole current are balanced and the threshold voltage becomes substantially constant when the erasure time is 10 msec or less. Contrary to this, where the erasure voltage is a large −8V, the threshold voltage is still falling even if the erasure time is 100 msec. In this case, although not shown in the figure, saturation (end of fall of the threshold voltage) occurs due to the fact that the dispersed charge storing means are finite in a time domain longer than near the erasure time 1 sec. Under other conditions where the erasure voltage is between −10V and −8V, the current balanced point becomes successively located between the erasure times 100 msec and 1 sec.

The voltage of the current balanced point at the start where this threshold voltage becomes constant corresponds to the inflection point voltage Vinf in the memory hysteresis characteristic of FIG. 7.

Once reaching the balanced point of the electron current and the hole current, even when taking a longer time, the erasure (reduction of Vth) does not advance much more at all. Further, when only the erasure time is increased while maintaining a high erasure voltage, the rewrite characteristic (endurance characteristic) of the memory transistor is liable to deteriorate. Accordingly, in the erasure of a MONOS type memory transistor, desirably a high voltage is applied for as short a time as possible in order to increase the speed.

From such a viewpoint, the erasure voltage in the present embodiment is set the same as the inflection a point voltage, which becomes larger in absolute value together with a reduction of the erasure time, or between the voltage of the inflection point and the minimum voltage for generating the electric field required for saturation of the dispersed charge storing means (−8V in the present example). In order to achieve a further higher speed erasure within this range of setting of the erasure voltage, desirably the erasure voltage (and the erasure time) is set near the inflection point voltage or at a slightly positive side from the inflection point voltage.

It was learned from the above that the erasure voltage and the erasure time could be set as a combination of an erasure time from 9 to 10 msec in the case of an erasure voltage of −9V and an erasure time of 5 msec in the case of an erasure voltage of −9.5V in order to, shorten the erasure time and raise the speed. Due to this, the speed of erasure could be raised by one order or more from that of the-related art.

Figure 9:
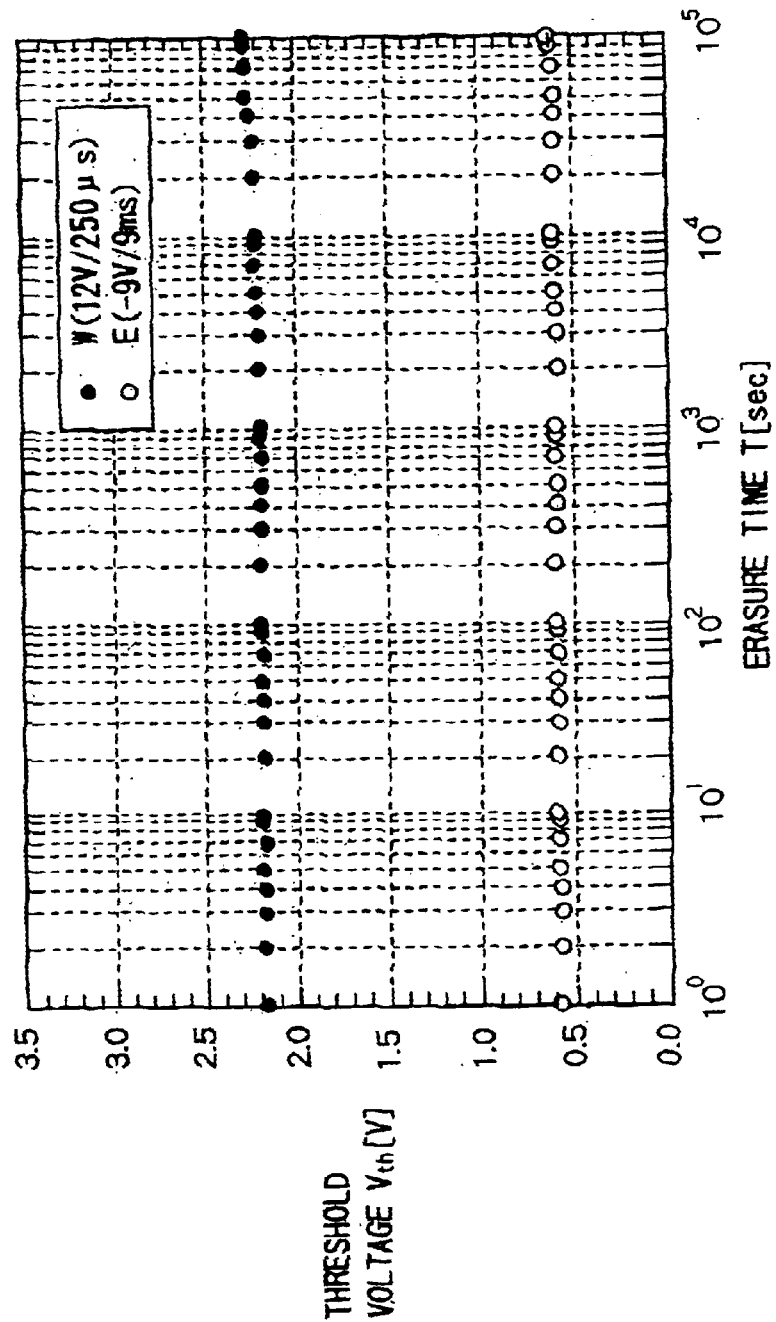
FIG. 9 is a graph showing a data rewrite characteristic in a case of an erasure voltage of 9V and an erasure time of 9 msec in an nMOS memory transistor according to the first embodiment of the present invention.

FIG. 9 shows the data rewrite characteristic of the case of an erasure voltage of −9V and an erasure time of 9 msec.

From FIG. 9, a good date rewrite characteristic with which the threshold value window did not change much at all in width even after 100,000 rewrites was obtained. Due to this, it could be confirmed that the date rewrite characteristic does not deteriorate even If the erasure voltage is raised in accordance with the inflection point voltage Vinf of the memory hysteresis characteristic, which shifts together with the shortening of the erasure time.

Further. FIG. 10 shows a read disturb characteristic after 100,000 data rewrites. It is learned that the threshold value window after 10 years, found by linear extrapolation of the measurement values, was at least the 0.5V required in practical use. Due to this, it could be confirmed that continuous reading for 10 years was possible even if the erasure voltage was raised after shortening the erasure time.

Second Embodiment

In the present embodiment, the method of an erase operation of a MONOS type memory transistor capable of preventing excess erasure is shown.

In the present embodiment, a memory cell array configuration and a memory transistor structure the same as those of the first embodiment were used.

As the erase operation, when erasing the memory cell array or blocks to be erased all together by a single erase operation, the threshold voltage of a memory transistor in the write state shifts to the threshold voltage in the erase state according to the erasure characteristic of FIG. 8.

In the case of the threshold voltage of a memory transistor in the erase state, however, there is the problem of excess erasure where the threshold voltage is lowered to a further lower level than that in the erase state according to a similar erasure characteristic.

Therefore, in order to reduce this excess erasure, erase operations combined with write operations, i.e., a write-erase (W-E), erase-write-erase (E-W-E), and write-erase-write-erase (W-E-W-E) operations have been tried out. In these erasure operations, the high voltage, high speed write method described in the first embodiment was employed for setting the erasure voltage and time. Specifically, as the conditions of the erasure operation, use was made of Vg=12V and 250 μsec for the write operation and Vg=−9V and 9 msec for the erase operation.

The results of these erasure operations are shown in FIG. 11. Further, FIG. 12 shows an enlarged region near the erasing level of FIG. 11.

As shown in FIG. 12, when further erasing a cell in the erase state, the threshold voltage becomes a value lower than the predetermined erasing level of Vth (E)=0.66V by 0.3V or more due to the excess erasure.

In order to reduce this excess erasure, when performing a write-erase (W-E) or erase-write-erase (E-W-E) operation, the threshold voltage is converged to within a range lower 0.04V than the predetermined erasing level Vth (E) to higher 0.04V than Vth (E). Further, in an operation repeating writing and erasure twice (W-E-W-E), the threshold voltage can be-converged to almost the same value as the predetermined erasing level Vth (E).

From the above, it could be confirmed by experiments that the problem of excess erasure could be eliminated by performing erasure at least once or about twice while performing a write operation in between. As a result, at the time of reading a NOR type cell, it becomes possible to greatly reduce the amount of leakage current from the non-selected cells increased due to the excess erasure.

Further, by the application of the method of an erasure operation of the present embodiment; even if the threshold voltage is completely converged, the required total erasure time still becomes short. Namely, the total number of the write or erase operations depends upon individual conditions of the write and erase operations, but in the experiments of the present embodiment, complete convergence was obtained after four times. In this case, the total time of the erase operation can be shortened to about one-fourth or less of the 80 to 100 msec of the related art, i.e., to 20 msec or less.

In a MONOS type memory transistor, since the charge storing means is made planarly disperse, variations in the gate length, channel width, elongation of the source impurity region, and the thicknesses of the films—which are factors determining the capacitive coupling ratio of the cells in the FG type—do not appear much as changes of the voltage to be applied to the tunnel insulating film. Further, there is no concern over a change of the quality of the tunnel insulating film due to a seepage of the impurity doped in the poly-crystalline silicon material of the floating gate into the tunnel insulating film as in the FG type. The variation of the distribution of the threshold voltage in a MONOS type memory transistor depends upon only the variation of the tunnel current arising due to nonuniformity of the thickness of the tunnel insulating film.

For the above reasons, in a MONOS type memory transistor, the distribution of the threshold voltage in the identical wafer—a cause of the excess erasure—is inherently small.

As opposed to this, in the FG type, due to fluctuation in the coupling ratio and seepage of the impurity described above, there is a large distribution of the threshold voltage in the wafer, but there is a relatively free movement of the stored charges in the floating gate. Further, in the PG type, generally there is no idea of making the threshold voltage gradually converge voltage by repeating write and erase operations.

Contrary to this, in the MONOS type, there is only a low degree of freedom of the charges trapped by the dispersed charge storing means in the lateral direction and the threshold voltage is controlled by the amount of charge stored in the carrier trap. Namely, the improvement of the convergence of the erasing threshold voltage Vth (E) by repeating a write and erase operation according to the present embodiment is a phenomenon peculiar to the write-erase mechanism of the MONOS type.

Note that there is a write operation before erasure even in the FG type, but the object of this to correct the variations of the threshold voltage as much as possible before erasure.

Contrary to this, in a MONOS type memory transistor in the present embodiment, there is an inherently small distribution of the threshold voltage in the wafer and the degree of variation is about 0.3 to 0.4V at most even by a single erasure. Accordingly, the write-erase (W-E) operation in the present embodiment is different from the write operation before erasure in the FG type in object and principle of operation in the point that it is carried out for stopping the erase operation in the middle of the convergence of the threshold voltage—which becomes complete after a plurality of write-erase operations—and for making the threshold voltage converge to a certain extent very roughly rather than correction of the distribution of the threshold voltage in the wafer.

Figure 13A:
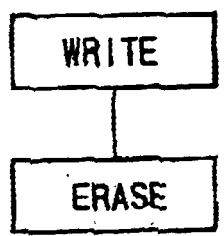
FIGS. 13A–C is a view of a mode of an erasure operation according to the second embodiment of the present invention.
Figure 13B:
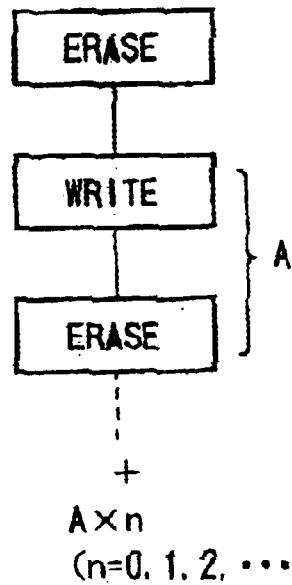
Figure 13C:
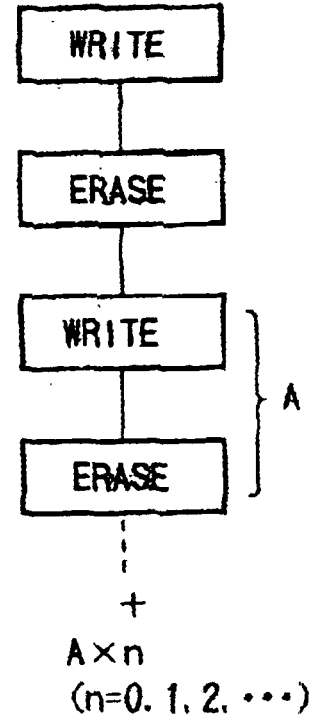

Note that, in an erasure operation including a plurality of erasures, where an improvement of the convergence can be further expected according to the individual conditions of the write and erase operations, it is also possible to further continuously perform the write-erase operations. FIG. 13 summarizes the modes of the erasure operation according to the present invention.

Further, in order to further increase the erasure speed in the present embodiment, it is also possible to include an erase step using an erasure voltage exceeding the inflection point voltage Vinf in absolute value in the plurality of erase steps in the erasures operation—assuming that the time is short enough so that no great reduction of the threshold value window or deterioration of the endurance characteristic is caused.

Below, an explanation will be made of other embodiments concerning the memory cell array constitution and the structures of the memory cells and memory transistors capable of exhibiting similar effects by application of the method of improvement of convergence of the erasing threshold voltage according to this second embodiment and/or the high speed erasing method according to the first embodiment.

Third Embodiment

The present embodiment relates to a modification of the memory cell structure and cell array structure.

The memory cell and memory cell array according to the present embodiment are a separated source line NOR type wherein bit lines and source lines are made hierarchical.

Figure 14:
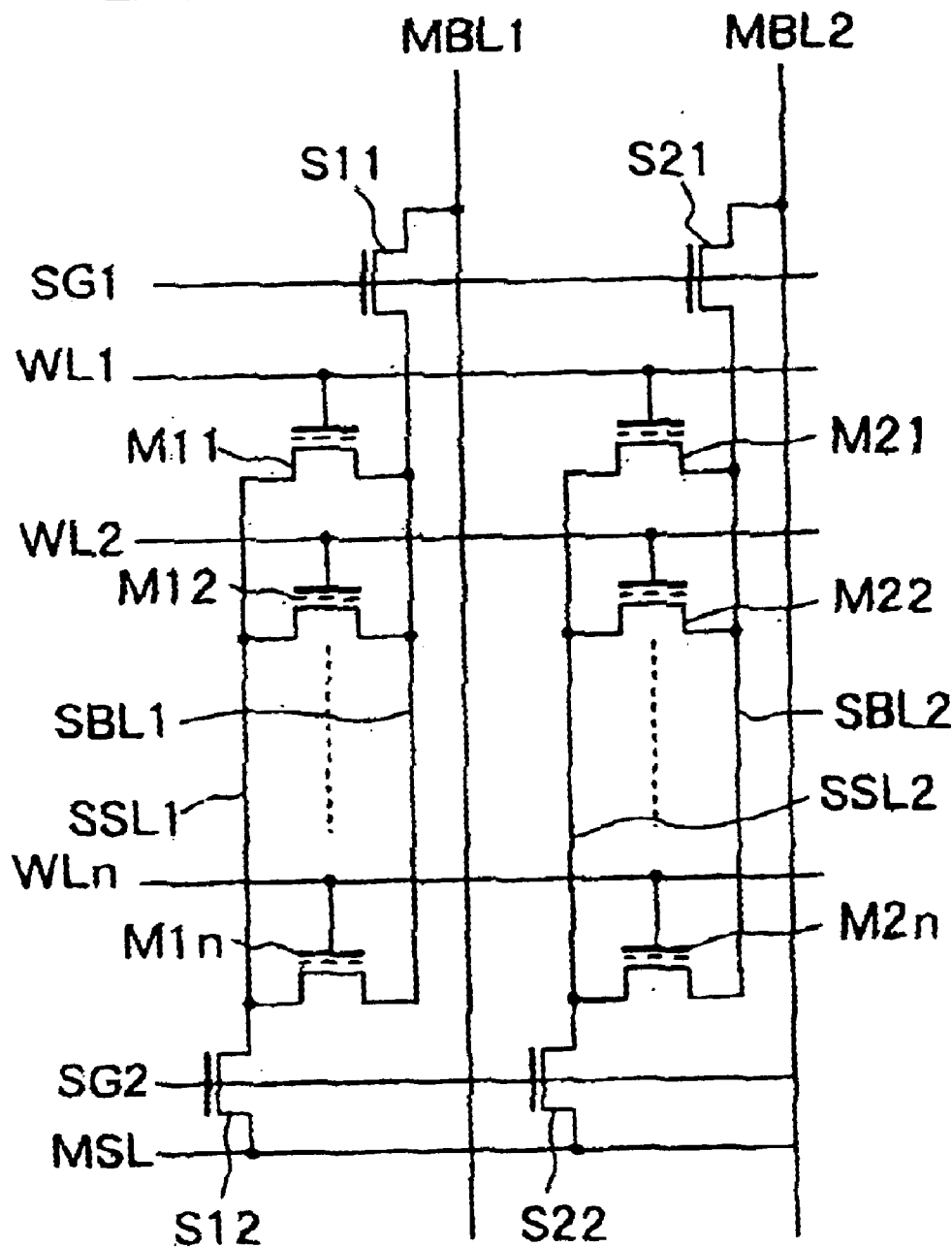
FIG. 14 is a circuit diagram of the circuit configuration of a separated source line NOR type memory cell array according to a third embodiment of the present invention.
Figure 15:
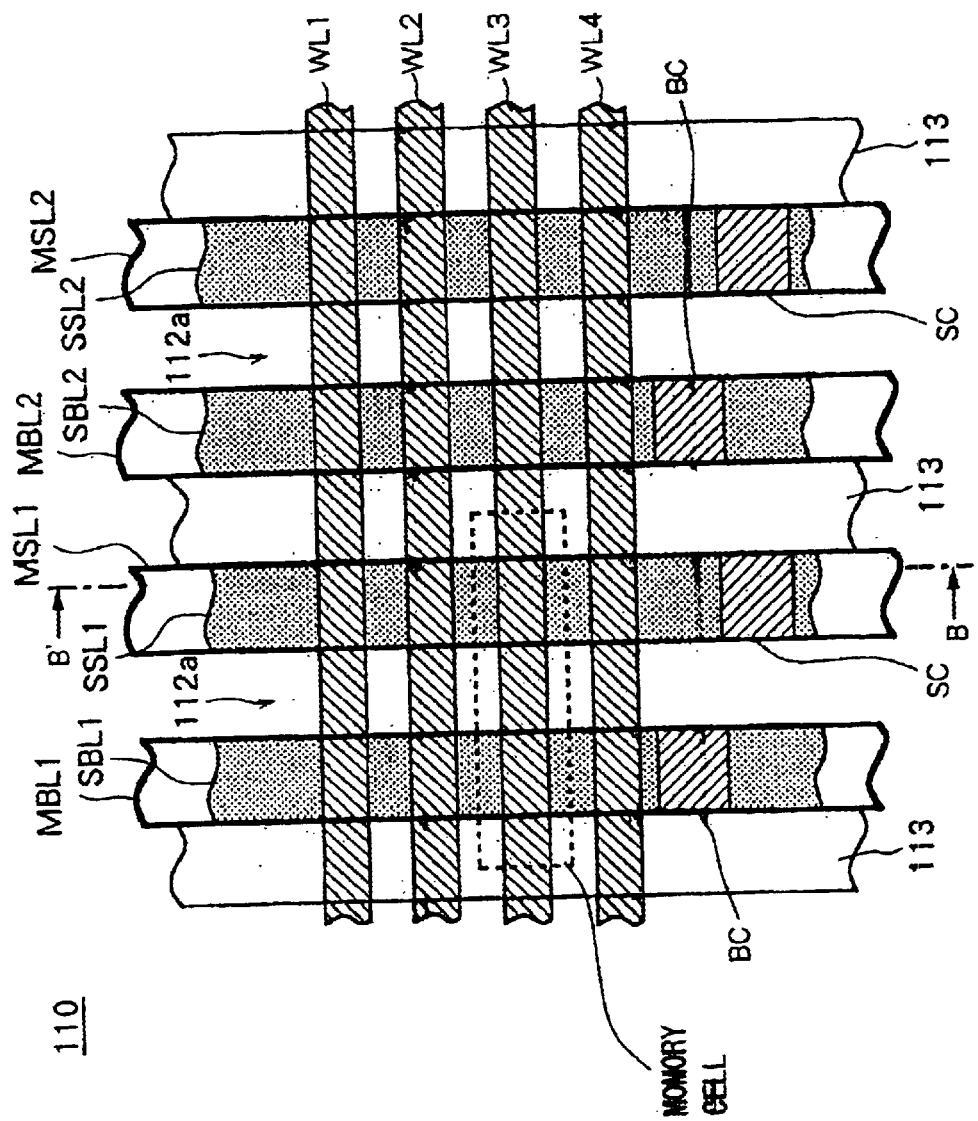
FIG. 15 is a plan view of a pattern example in a separated source line NOR type memory cell array according to the third embodiment of the present invention.
Figure 16:
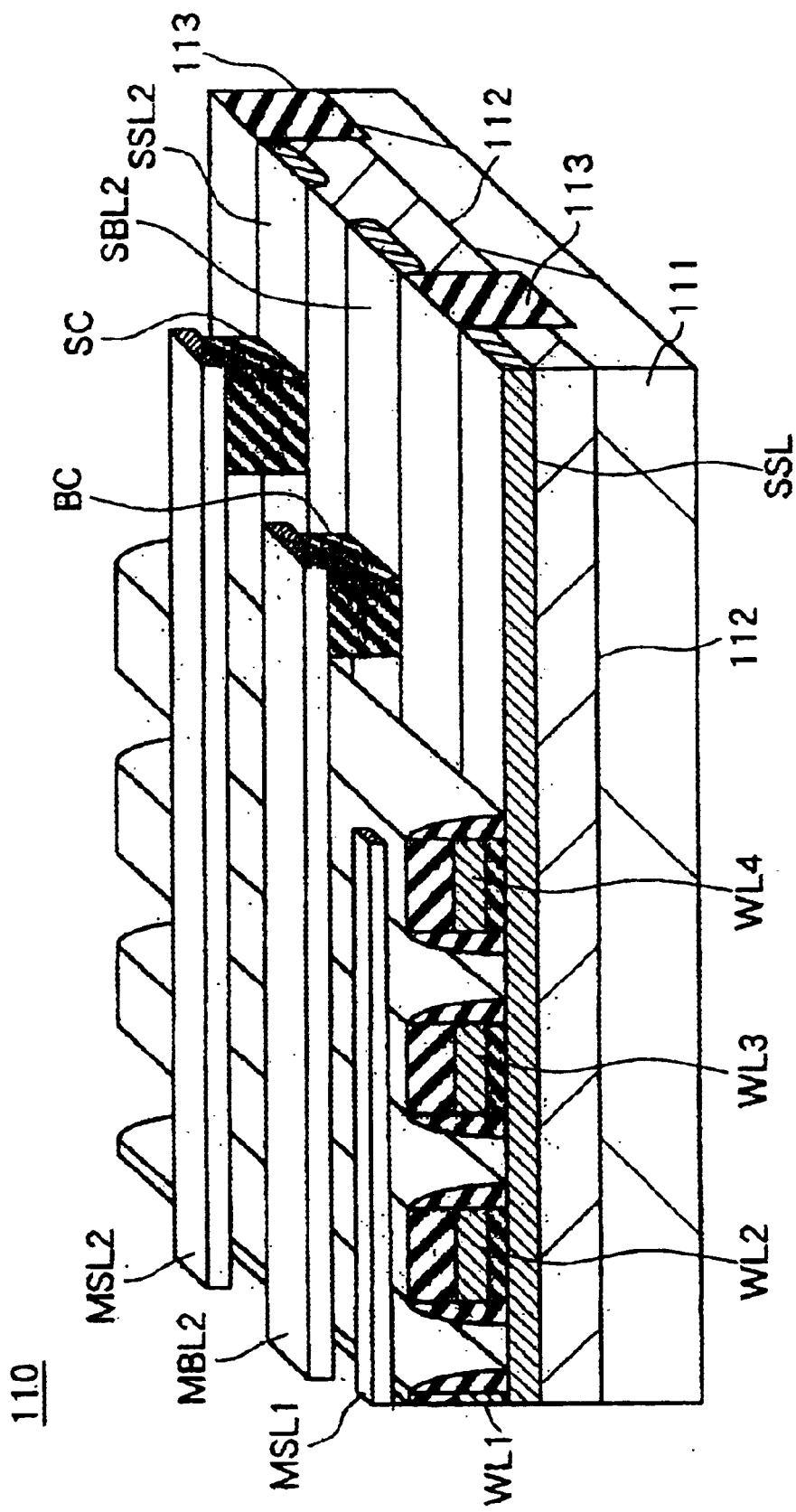
FIG. 16 is a bird's eye view seen from a cross-section taken along the line B–B' in FIG. 15 in a separated source line NOR type memory cell array according to the third embodiment of the present invention.

FIG. 14 shows the circuit configuration of a NOR type memory cell array. Also, FIG. 15 is a plan view of a pattern example of a NOR type memory cell array, and FIG. 16 is a bird's eye view seen from a cross-section taken along the line B–B' in FIG. 15.

In the non-volatile memory device 110, the bit lines are arranged in a hierarchy of main bit lines and sub bit lines, while source lines are arranged in a hierarchy of main source lines and sub source lines. A main bit line MBL1 is connected to a sub bit line SBL1 via a selection transistor S11, while a main bit Line MBL2 is connected to a sub bit line SBL2 via a selection transistor S21. Also, a main source line MSL (divided to MSL1 and MSL2 in FIG. 16) is connected to a sub source line SSL1 via a selection transistor S12 and to a sub source line SSL2 via a selection transistor S22.

Between the sub bit line SBL1 and sub source line SSL1 are connected memory transistors M11 to M1n in parallel, while between the sub bit line SBL2 and the sub source line SSL2 are connected memory transistors M21 to M2n in parallel. The (n) number of memory transistors connected in parallel and two selection transistors (S11 and S12, or S21 and S22) comprise a unit block of a memory cell array.

The gates of the adjacent memory transistors M11, M21, . . . in the word direction are connected to a word line WL1. In the same way, the gates of the memory transistors M12, M22, . . . are connected to the word line WL2, while the gates of the memory transistors M1n, M2n, . . . are connected to a word line WLn.

The selection transistors S11, S21, . . . adjacent in the word direction are controlled by a selection line SG1, while the selection transistors S12, S22, . . . are controlled by a selection line SG2.

In the NOR type cell array 110, as shown in FIG. 16, a p-well 112 is formed in the surface region of the semiconductor substrate 111. The p-well 112 is insulated and separated in the word line direction by element separation insulating layer 113 formed by burying an insulation material in a trench and is arranged in parallel stripes.

The p-well portions separated by the element separation insulating layer 112 become active regions of the memory transistor. On the two sides of the active region in the width direction, n-type impurities are doped at a high concentration in parallel stripes at certain distances from each other, whereby the sub bit line SBL and the sub source line SSL are formed.

The word lines WL1. WL2, WL3, VL4, . . . are arranged at regular intervals perpendicularly intersecting the sub bit lines SBL and sub source lines SSL via an insulating film. The word lines are, as will be explained later on, configured by stacking a gate insulating film comprised by a tunnel insulating film, nitride film, and top insulating film and a gate electrode.

The intersecting portion of a p-well portion 112 between sub bit line SBL and sub source line SSL with a word line becomes a channel-forming region of the memory transistor. The sub bit line portion in contact with the channel-forming region functions as a drain, while the sub source line portion functions as a source.

The top portions and the side walls of the word lines are, in the same way as the case in FIG. 3, covered with offset insulating layers and side wall insulating layers (normal interlayer insulating layer may be applied in the present embodiment).

These insulating layers are formed with bit contact plugs BC reaching the sub bit lines SBL and source contact plugs SC reaching the sub source lines SSL at predetermined intervals. These plugs BC and SC are provided for every 128 memory transistors in the bit line direction.

Also, on the insulating layer is formed main bit lines MBL1, BL2, . . . contacting the bit contact plugs BC and main source lines MSL1, SL2 contacting the source contact plugs BC alternately in a parallel stripe shape.

The miniature NOR type cell array 110 has bit lines and source lines arranged in a hierarchy. It is not necessary to form the bit contact plug BC and source contact plug SC for each memory cell. Accordingly, there is basically no variation in the contact resistance itself. A bit contact plug BC and source contact plug SC are provided for example for every 128 memory cells, but when the plugs are not formed by self alignment, the offset insulating layer and side wall insulating layer are not necessary. Namely, it is enough to thickly deposit an ordinary interlayer insulating film to bury the memory transistors.

As explained above, in the present embodiment, there is the advantage that the process can be further simplified.

Also, since there is almost no wasted space as the pseudo contact-less structure where sub interconnections (sub bit lines and sub source lines) are comprised by an impurity region, when the layers are formed at a minimum line width F of the wafer process limit, production is possible with a very small cell area close to $8F^2$.

Furthermore, since the bit lines and source lines are arranged in a hierarchy and the selection transistor S11 or S21 separates a parallel main transistor group in non-selected unit block from the main bit line MBL1 or MBL2, the load-capacitance of the main bit line to remarkably reduced which results in advantages of a higher speed and lower power consumption. Also, due to the action of the selection transistor S12 or S22, it is possible to separate the sub source lines from the main source lines and lower the load-capacitance.

Note that it is preferable for a higher speed to form the sub bit lines SBL1 and SBL2 or sub source lines SSL1 and SSL2 in an impurity region being bonded with a silicide and to use metal interconnections for the main bit lines MBL1 and MBL2.

In the same way as in the first embodiment, by optimizing the erasure voltage and increasing the erasure electric field, the erasure time can be shortened and the speed can be raised.

Further, by the write-erase, erase-write-erase, or write-erase-write-erase erasure operation, at the time of erasing the entire memory cell array or entire blocks, the threshold voltage in the erased state was converged with an extremely high precision and the disadvantages due to excess erasure such as the increase of the leakage current from the non-selected cells can be solved.

Fourth Embodiment

The present embodiment relates to a non-volatile semiconductor memory device using as dispersed charge storing means of memory transistors a plurality of Si-nano crystals buried in a gate insulating film, having a particle size of for example 10 nm or less, and mutually insulated from each other (hereinafter referred to as a Si-nano crystal type).

FIG. 17 is a sectional view of the element configuration of an Si-nano crystal type memory transistor.

The Si-nano crystal non-volatile memory is different from the first embodiment in the points that a gate insulating film 30 of the present embodiment takes the place of the nitride film 12 and the top insulating film 14 and that a Si-nano crystals 32 serving as dispersed charge storing means on the tunnel insulating film 10 and an oxide film 34 thereon are formed between gate electrodes 8.

The rest of the configuration, that is, the semiconductor substrate 1, channel-forming region la, source region 2, drain region 4, tunnel insulating film 10, and gate electrode 8, are the same as those in the first embodiment.

A Si-nano crystal 32 has a size (diameter) of preferably 10 nm or less, for example, about 4.0 nm. Si-nano crystals are spatially separated by the oxide film 34 at intervals of for example 4 nm.

The tunnel insulating film 10 in the present embodiment is a little thicker than in the first embodiment due to the dispersed charge storing means (Si-nano crystals 32) being close to the substrate side. The thickness can be suitably selected within the range from 2.6 nm to 5.0 nm in accordance with the application of use. Here, the film thickness was made about 3.5 nm.

In the production of a memory transistor configured as such, after forming the tunnel insulating film 10, a plurality of Si-nano crystal 32 are formed on the tunnel oxide film 10 for example by the low-pressure (LP) CVD method. Also, the oxide film 34 is formed for example to about 7 nm by LP-CVD so as to bury the Si-nano crystals 32. In LP-CVD, it is assumed that the material gas is a mixed gas of dichloroslane (DCS) and $N_2O$ and the substrate temperature is for example 700° C. At this time, the Si-nano crystals 32 are burled in the oxide film 34 and the surface of the oxide film is made to flat. When it does not become sufficiently flat, it is preferable to newly perform a flattening process (for example, chemical mechanical polishing (CMP)). Next, steps of forming the gate electrodes 8 and patterning the gate laminated films 10, 34 and 8 all at once are performed to complete the Si-nano crystal type memory transistor.

The Si-nano crystals 32 formed as such function as carrier traps made discrete in the planar direction. The trap level can be estimated by a band discontinuity with the surrounding silicon oxide. The estimated value is about 3.1 eV. Si-nano crystals 32 of such a size can hold several injected electrons. Note that the Si-nano crystals 32 may be made further smaller and hold single electron.

An Si-nanocrystal type non-volatile memory configured as such was examined as to its data holding characteristic by a Lundkvist's back-tunneling model. It is important to widen the trap level and to make the distance between the center of distribution (or centroide) of charges and a semiconductor substrate 1 longer. Thus, data retention in the case of a trap level of 3.1 eV was examined by a simulation using the Lundkvist's model as a physical model. As a result, it was found that preferable data retention was shown by using deep carrier traps of a trap level 3.1 eV even when the distance from a charge holding medium to the channel-forming region la is a relatively short about 4.0 nm.

In the same way as in the first embodiment, by optimizing the erasure voltage and increasing the erasure electric field, the erasure time can be shortened and the speed can be raised.

Further, by the write-erase, erase-write-erase, or write-erase-write-erase erasure operation, at the time of erasing the entire memory cell array or entire blocks, the threshold voltage in the erased state was converged with an extremely high precision and the disadvantages due to excess erasure such as the increase of the leakage current from the non-selected cells can be solved.

Fifth Embodiment

The present embodiment relates to a non-volatile memory device using a large number of fine division type floating gates burled in an insulating layer as dispersed charge storing means of a memory transistor (hereinafter referred to as a fine divided FG type).

FIG. 18 is a sectional view of the element configuration of a fine divided FG type memory transistor.

The fine divided FG type non-volatile memory of the present embodiment differs from the above first embodiment in that the memory transistors are formed on a SOI substrate and that, instead of the nitride film 12 and the top insulating film 14, the gate insulating film 40 of the present embodiment is comprised of fine divided floating gates 42 as dispersed charge storing means on the tunnel insulating layer 10 and an oxide film 44 on the same formed under the gate electrodes 8.

In the rest of the configuration, the tunnel insulating film 10 and gate electrode 8 are the same as in the first embodiment.

The fine divided floating gate 42, together with the Si-nano crystals 32 of the third embodiment, corresponds to a specific example of a "fine particle conductor" mentioned in the present invention.

As the SOI substrate, a separation by implantation oxygen (SIMOX) substrate wherein oxygen ions are injected in a silicon substrate at high concentration by ion implantation and a buried oxide film is formed at a deeper position than the substrate surface or a bonded substrate wherein an oxide film is formed on the surface of one silicon substrate and bonded to another substrate may be used. The SOI substrate shown in FIG. 18 formed by the above method is comprised of a semiconductor substrate 46, separation oxide film 48, and silicon layer 50, wherein the silicon layer 50 is comprised of a channel-forming region 50a, source region 2, and drain region 4.

Note that a glass substrate, plastic substrate, sapphire substrate, etc. may be used instead of a semiconductor substrate 46.

The fine divided floating gate 42 is obtained by processing a normal FG type floating gate to fine poly-Si dots having heights of for example about 5.0 nm and diameters of for example up to 8 nm.

The tunnel insulating film 10 in the present embodiment is a little thicker than that in the first embodiment, but is formed much thinner compared with a normal FG type and can be suitably selected within the range of 2.5 nm to 4.0 nm in accordance with the application of use. Here, it is made a thickness of 3.0 nm.

In the production of a memory transistor configured as above, a tunnel insulating film 10 is formed on the SOI substrate, then a polycrystalline silicon film (final thickness 5 nm) is formed on the tunnel insulating film 10 by for example LP-CVD. In the LP-CVD, the material gas is made a mixed gas of DCS and ammonia and the substrate temperature is made for example 650° C. Next, the polycrystalline silicon film is processed to fine poly-Si dots having a diameter of for example 8 nm or less by using for example electron beam exposure. The poly-Si dots function as fine divided type floating gates 42 (dispersed charge storing means). Next, an oxide film 44 of for example 9 nm is formed by LP-CVD so as to bury the fine divided type floating gates 42. In the LP-CVD, the material gas is made a mixed gas of DCS and $N_2O$ and the substrate temperature is made for example 700° C. At this time, the fine divided type floating gates 42 are buried in the oxide film 44 and the surface of the oxide film 44 is flattened. When it does not become sufficiently flat, it is preferable to newly perform a flattening process (for example, CMP). Next, steps of forming the gate electrodes B and patterning the gate laminated films all at once are performed to complete the fine divided FG type memory transistor.

A device was fabricated using an SOI substrate In this way and finely dividing the floating gate. Its characteristics were evaluated. As a result, it was confirmed that, as expected, good characteristics could be obtained.

In the same way as in the first embodiment, by optimizing the erasure voltage and increasing the erasure electric field, the erasure time can be shortened and the speed can be raised.

Further, by the write-erase, erase-write-erase, or write-erase-write-erase erasure operation, at the time of erasing the entire memory cell array or entire blocks, the threshold voltage in the erased state was converged with an extremely high precision and the disadvantages due to excess erasure such as the increase of the leakage current from the non-selected cells can be solved.

Modifications

Various modifications can be made to the above first to fourth embodiments.

While not specifically illustrated, the present invention can also be applied to a divided bit line NOR (DINOR) type, a so-called high capacitance-coupling ratio (HiCR) type or fine NOR type cell comprising a cell arrays of a separated source line type wherein source lines are commonly used by two adjacent source regions.

"Dispersed charge storing means" in the present invention includes carrier traps of a nitride film bulk and carrier traps formed near an interface of an oxide film and nitride film, so the present invention can be applied even to an MNOS type wherein the gate insulating film is a nitride-oxide (NO) film.

The present invention can also be applied to an embedded type non-volatile memory formed on the same substrate as a logic circuit in addition to a stand-alone type non-volatile memory.

Note that use of an SOI substrate like in the fifth embodiment can be simultaneously applied with the configurations of the memory transistors of the first to fourth embodiments.

Summarizing the effects of the present invention, according to the method of erasing a non-volatile semiconductor memory device according to the present invention, as a single erasure operation, use may be made of a write-erase operation, an operation including at least time write-erase after an erase operation, or an operation including a plurality of write-erase operations can be employed. By this, the threshold voltage in the erase state is easily made to converge to the intended value, and the disadvantage due to excess erasure, for example, the leakage current from the non-selected cells in NOR type cells, can be solved.

Further, regarding the setting of the erasure voltage and the erasure time, the erasure voltage can be set in a range expanded to the negative side together with the shortening of the erasure time, so the increase of the erasure voltage and the shortening of the erasure time become easy. Due to this, a memory transistor can be erased at a speed higher than that in the related art by one order or more.

By applying such a high voltage, short time erasing method to the case where a plurality of erase steps are performed in a single erasure operation, the total erasure time can be made greatly shorter than that of the related art even if the convergence of the erasure threshold voltage is improved.

With this method of operation comprising these plurality of the erase steps, if including an erase operation using an erasure voltage exceeding the inflection point voltage in absolute value, further higher speed erasure becomes possible.

Further, in the non-volatile semiconductor memory device according to the present invention, since the gate insulating film of the memory transistor has specifications to which the high voltage, short time erasing method described above can be easily applied, it is easy to increase the speed.

While the invention has been described with reference to specific embodiment chosen for purpose of illustration, it should be apparent that numerous modifications could be made thereto by those skilled in the art without departing from the basic concept and scope of the invention.

What is claimed is:

1. A method of erasing a non-volatile semiconductor memory device having a memory transistor comprising a source region and a drain region with a channel-forming region therebetween, a gate insulating film provided on the channel-forming region and further including dispersed charge storing means, and a gate electrode on the gate insulating film, said method comprising, when erasing the memory transistor, the steps of:
first performing an erase operation; and thereafter performing a write-erase operation at least once.

2. A method of erasing a non-volatile semiconductor memory device as set forth in claim 1, wherein said memory device comprises:
a plurality of memory transistors arranged in a bit direction and a word direction;
a plurality of word lines;
a plurality of common lines in the bit direction intersecting the plurality of word lines in an electrically insulated state;
a plurality of the gate electrodes connected to the plurality of word lines; and
a plurality of said source regions or drain regions coupled to said plurality of common lines.

3. A method of reading a non-volatile semiconductor memory device as set forth in claim 2, wherein said memory device comprises:
a word line for commonly connecting said gate electrodes in the word direction;
a source line for commonly connecting said source regions in the bit direction; and
a bit line for commonly connecting said drain regions in the bit direction.

4. A method of erasing a non-volatile semiconductor memory device as set forth in claim 3, wherein: in said memory device,
said source line comprises a sub source line for commonly connecting said source regions arranged in the bit direction, and a main source line for commonly connecting sub source lines in the bit direction; and
said bit line comprises a sub bit line commonly connecting said drain regions arranged in the bit direction, and a main bit line for commonly connecting sub bit lines in the bit direction.

5. A method of reading a non-volatile semiconductor memory device as set forth in claim 1, wherein said memory device comprises the dispersed charge storing means arranged to be separated from said channel-forming region.

6. A method of erasing a non-volatile semiconductor memory device as set forth in claim 1, wherein the dispersed charge storing means does not have conductivity over an entire surface direction facing said channel-forming region.

7. A method of erasing a non-volatile semiconductor memory device as set forth in claim 6, wherein said gate insulating film includes:
a tunnel insulating film on said channel-forming region; and
a nitride film or an oxynitride film on the tunnel insulating film.

8. A method of erasing a non-volatile semiconductor memory device as set forth in claim 6, wherein said gate insulating film includes:
a tunnel insulating film on said channel-forming region; and
mutually insulated fine particle conductors formed on the tunnel insulating film as the dispersed charge storing means.

9. A method of erasing a non-volatile semiconductor memory device as set forth in claim 8, wherein said fine particle conductors have a particle diameter of not more than 10 nm.

10. A method of erasing a non-volatile semiconductor memory device having a memory transistor comprising a source region and a drain region with a channel-forming region there between, a gate insulating film provided on the channel-forming region and further including dispersed charge storing means, and a gate electrode on the gate insulating film, the method comprising, when erasing the memory transistor, the steps of:
first performing a write operation; and thereafter performing an erase operation
performing a second write operation; and thereafter
performing a second erase operation.

11. The method of erasing a non-volatile semiconductor memory of claim 10, further comprising the step of repeating the steps of performing write and erase operations.

12. A method of erasing a non-volatile semiconductor memory device having a memory transistor comprising a source region and a drain region with a channel-forming region there between, a gate insulating film provided on the channel-forming region and further including dispersed charge storing means, and a gate electrode on the gate insulating film, said method comprising the steps of:
setting an erasure voltage and/or erasure time based on an inflection point in a hysteresis curve of change comparing a threshold voltage with respect to an applied voltage of said memory transistor; and
erasing said memory transistor by using that erasure voltage and/or erasure time.

13. A method of erasing a non-volatile semiconductor memory device as set forth in claim 12, comprising the steps of:
setting the erasure voltage within a range not exceeding a voltage of said inflection point in absolute value; and
erasing said memory transistor using the set erasure voltage and corresponding erasure time.

14. A method of erasing a non-volatile semiconductor memory device as set forth in claim 13, comprising the steps of:
setting said erasure voltage at a same value as the voltage of said inflection point or between the voltage of the inflection point and a minimum voltage for generating an electric field required for causing said charge storing means to become saturated.

15. A method of erasing a non-volatile semiconductor memory device having a memory transistor comprising a source region and a drain region with a channel-forming region there between, a gale insulating film provided on the channel-forming region and further including dispersed charge storing means, and a gate electrode on the gate insulating film, said method comprising the steps of:
setting an erasure voltage to a voltage of an inflection point in a hysteresis curve comparing a change of threshold voltage with respect to an applied voltage of said memory transistor or between the voltage of the inflection point and a minimum voltage for generating an electric field required for causing said dispersed charge storing means to become saturated; and
erasing said memory transistor using the erasure voltage.

16. A method of erasing a non-volatile semiconductor memory device having a memory transistor comprising a source region and a drain region with a channel-forming region there between, a gate insulating film provided on the channel-forming region and further including dispersed charge storing means, and a gate electrode on the gate insulating film, said method comprising, in a single erasure procedure of said memory transistor, the steps of:
performing a plurality of erase operations including an erase operation using an erasure voltage that is equal to or less than an absolute value of an inflection point voltage at an erasing side in a hysteresis curve comparing a change of threshold voltage with respect to an applied voltage of the memory transistor and thereafter changing the erasure voltage and an erasure time.

17. A method of erasing a non-volatile semiconductor memory device as set forth in claim 16, further comprising the step of:
repeating erase and write operations a plurality of times in the above single erasure procedure.

18. A method of erasing a non-volatile semiconductor memory device as set forth in claim 16, further comprising the steps of:
performing an erase operation once; and
performing a write-erase operation at least once in the above single erasure procedure.

19. A method of erasing a non-volatile semiconductor memory device as set forth in claim 16, further comprising the steps of:
performing a write operation; and
performing erase operation in the above single erasure procedure.

20. A method of erasing a non-volatile semiconductor memory device as set forth in claim 16, further comprising the step of:
erasing by using an erasure voltage having a larger absolute value than the voltage of the inflection point.

21. A method of erasing a non-volatile semiconductor memory device as set forth in claim 16, further comprising the step of:
setting the erasure voltage and the erasure time based on a shift of the inflection point to a negative side when shortening a voltage application time.

22. A method of erasing a non-volatile semiconductor memory device as set forth in claim 12, wherein said memory device comprises:
a plurality of memory devices arranged in a bit direction and a word direction;
a plurality of word lines;
a plurality of common lines in the bit direction intersecting the plurality of word lines in an electrically insulated state;
a plurality of said gate electrodes connected to said plurality of word lines; and
a plurality of said source regions or drain regions coupled to said plurality of common lines.

23. A method of reading a non-volatile semiconductor memory device as set forth in claim 22, wherein said memory device comprises:
a word line for commonly connecting said gate electrodes in the word direction;
a source line for commonly connecting said source regions in the bit direction; and
a bit line for commonly connecting said drain regions in the bit direction.

24. A method of erasing a non-volatile semiconductor memory device as set forth in claim 23, wherein:
said source line comprises a sub source line for commonly connecting said source regions in the bit direction, and a main source line for commonly connecting sub source lines in the bit direction; and said bit line comprises a sub bit line commonly connecting said drain regions in the bit direction, and a main bit line for commonly connecting sub bit lines in the bit direction.

25. A method of erasing a non-volatile semiconductor memory device as set forth in claim 12, wherein said memory device comprises the dispersed charge storing means separated from said channel-forming region.

26. A method of erasing a non-volatile semiconductor memory device as set forth in claim 12, wherein the dispersed charge storing means does not have conductivity over an entire surface facing said channel-forming region at least when charges do not dissipate outside.

27. A method of erasing a non-volatile semiconductor memory device as set forth in claim 26, wherein said gate insulating film includes:

a tunnel insulating film on said channel-forming region; and a nitride film or an oxynitride film on the tunnel insulating film.

28. A method of erasing a non-volatile semiconductor memory device as set forth in claim 26, wherein said gate insulating film includes:

a tunnel insulating film on said channel-forming region; and mutually insulated fine particle conductors formed on the tunnel insulating film as the dispersed charge storing means.

29. A method of erasing a non-volatile semiconductor memory device as set forth in claim 28, wherein said fine particle conductors have a particle diameter of not more than 10 nm.

\* \* \* \* \*